US009705283B1

United States Patent
Deppe et al.

(10) Patent No.: US 9,705,283 B1
(45) Date of Patent: Jul. 11, 2017

(54) DIFFUSED CHANNEL SEMICONDUCTOR LIGHT SOURCES

(71) Applicant: University of Central Florida Research Foundation, Inc., Orlando, FL (US)

(72) Inventors: Dennis G. Deppe, Oviedo, FL (US); Guowei Zhao, Apopka, FL (US)

(73) Assignees: University of Central Florida Research Foundation, Inc., Orlando, FL (US); sdPhotonics, LLC, Oviedo, FL (US)

( * ) Notice: Subject to any disclaimer, the term of this patent is extended or adjusted under 35 U.S.C. 154(b) by 0 days.

(21) Appl. No.: 14/717,692

(22) Filed: May 20, 2015

Related U.S. Application Data

(63) Continuation-in-part of application No. 14/282,547, filed on May 20, 2014, now Pat. No. 9,118,162.
(Continued)

(51) Int. Cl.
*H01S 5/187* (2006.01)
*H01S 5/183* (2006.01)
(Continued)

(52) U.S. Cl.
CPC .............. *H01S 5/187* (2013.01); *H01S 5/042* (2013.01); *H01S 5/18361* (2013.01); *H01S 5/423* (2013.01); *H04B 10/503* (2013.01)

(58) Field of Classification Search
CPC ...... H01S 5/183; H01S 5/18308; H01S 5/423; H01S 5/18322; H01S 5/18303;
(Continued)

(56) References Cited

U.S. PATENT DOCUMENTS 5,226,053 A  7/1993  Cho et al.
5,594,751 A * 1/1997  Scott ................... H01S 5/18333
                                                  372/46.013
(Continued)

FOREIGN PATENT DOCUMENTS

EP      0317007      *  5/1989
WO      9750109         12/1997

OTHER PUBLICATIONS

L.A. Coldren, et al., "Diode Lasers and Photonic Integrated Circuits", a Wiley-Interscience Publication, John Wiley & Sons, Inc. USA and Canada, 1995 (4 relevant pages from book).
(Continued)

*Primary Examiner* — Michael Carter
(74) *Attorney, Agent, or Firm* — Jetter & Associates, P.A.

(57) ABSTRACT

A semiconductor vertical resonant cavity light source includes an upper mirror and a lower mirror that define a vertical resonant cavity. A first active region is within the vertical resonant cavity for light generation between the upper mirror and lower mirror. The vertical resonant cavity includes an inner mode confinement region and an outer current blocking region. A depleted heterojunction current blocking region (DHCBR) is within the outer current blocking region of at least one of the upper mirror, lower mirror, and first active region. A conducting channel within the inner mode confinement region is framed by the DHCBR. The DHCBR forces current flow into the conducting channel during operation of the light source. A cavity length within the inner mode confinement region equals or exceeds the cavity length formed in the DHCBR.

18 Claims, 8 Drawing Sheets

Related U.S. Application Data

(60) Provisional application No. 62/000,869, filed on May 20, 2014.

(51) Int. Cl.
*H01S 5/42* (2006.01)
*H01S 5/042* (2006.01)
*H04B 10/50* (2013.01)

(58) Field of Classification Search
CPC .......... H01S 5/1833; H01S 5/026; H01S 5/40; H01S 5/18397; H01S 5/18305; H01S 5/041
See application file for complete search history.

(56) References Cited

U.S. PATENT DOCUMENTS

| | | | |
|---|---|---|---|
| 5,754,578 A | 5/1998 | Jayaraman | |
| 5,881,089 A | 3/1999 | Berggren et al. | |
| 6,563,141 B1 | 5/2003 | Dawson et al. | |
| 6,795,478 B2 * | 9/2004 | Hwang | H01S 5/18358 372/43.01 |
| 8,774,246 B1 * | 7/2014 | Deppe | H01S 5/18386 372/45.01 |
| 2001/0043636 A1 | 11/2001 | Bewley et al. | |
| 2002/0110196 A1 | 8/2002 | Nguyen et al. | |
| 2002/0176465 A1 * | 11/2002 | Kondow | B82Y 20/00 372/45.01 |
| 2002/0191656 A1 | 12/2002 | Mawst et al. | |
| 2005/0063440 A1 | 3/2005 | Deppe | |
| 2005/0249254 A1 | 11/2005 | Deppe | |
| 2010/0265976 A1 | 10/2010 | Bousquet et al. | |
| 2010/0272145 A1 | 10/2010 | Weichmann et al. | |
| 2011/0150019 A1 | 6/2011 | Leatherdale et al. | |
| 2015/0086220 A1 * | 3/2015 | Warren | H04B 10/503 398/200 |

OTHER PUBLICATIONS

Carl W. Wilmsen, et al., "Vertical-Cavity Surface-Emitting Lasers: Design, Fabrication, Characterization and Applications", Cambridge University Press, published Jan. 24, 2002, pp. 44-49, especially p. 49.

* cited by examiner

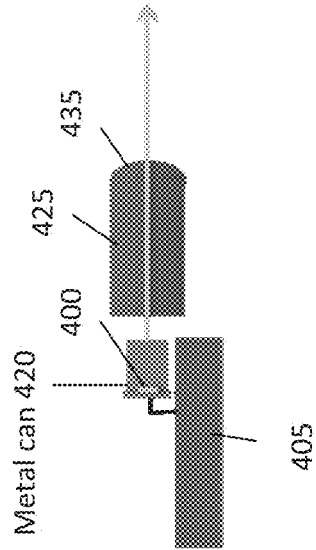
FIG. 4B
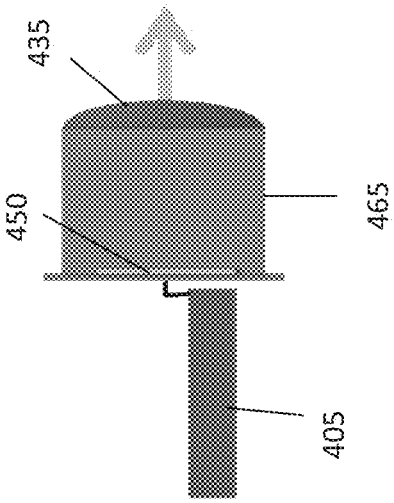
FIG. 4D
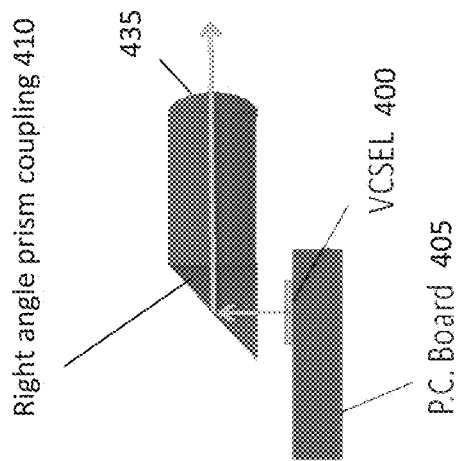
FIG. 4A
FIG. 4C

DIFFUSED CHANNEL SEMICONDUCTOR LIGHT SOURCES

CROSS REFERENCE TO RELATED APPLICATIONS

This application is (i) a continuation-in-part (CIP) application that claims the benefit of application Ser. No. 14/282,547 entitled "COMPOSITE SEMICONDUCTOR LIGHT SOURCE PUMPED BY A SPONTANEOUS LIGHT EMITTER" filed May 20, 2014 which is itself a CIP application that claims the benefit of application Ser. No. 13/352,050 entitled "SEMICONDUCTOR LIGHT SOURCES INCLUDING SELECTIVE DIFFUSION FOR OPTICAL AND ELECTRICAL CONFINEMENT" filed on Jan. 17, 2012, now U.S. Pat. No. 8,774,246, and this application is also (ii) a non-provisional application which claims the benefit of provisional Application No. 62/000,869 entitled "DIFFUSED CHANNEL LIGHT SOURCES AND OPTICAL DATA NETWORKS THEREFROM" filed on May 20, 2014, which are all herein incorporated by reference in their entireties.

STATEMENT REGARDING FEDERALLY SPONSORED RESEARCH

This invention was made with Government support under Phase II SBIR Contract No. W911NF-14-C-0088 awarded by the Department of Defense (DOD) funding agency, the Army Research Laboratory. The U.S. Government has certain rights in this invention.

FIELD

Disclosed embodiments relate to semiconductor vertical cavity diode light sources that include diffused-channel structures for optical and electrical confinement and tactical engagement systems having laser transmitters therefrom.

BACKGROUND

High-speed optical data networks generally use semiconductor light sources including vertical cavity devices to generate the light used to carry optical signals through an optical medium from a transmitter to a receiver. The semiconductor light source is typically driven by an electronic chip that conditions electrical data into electrical drive waveforms for the light sources. The light sources then transmit the data in optical data waveforms. The receiver typically includes photodetectors to convert the optical data waveforms from the transmitter back to electrical signals that can then be amplified and converted into electrical data waveforms. High-speed optical data networks can transmit data at much high data speeds than possible with purely electrical data networks.

Optical data networks are used in military applications such as simulating weaponry, training soldiers, combat identification of friend or foe, and other applications. An example of such a training system used by the United States Army is the Multiple Integrated Laser Engagements System (MILES). Another such training system is the Optische Schnittstelle fur Agdus and GefUbz H (OSAG), translated Optical Interface for Force-on-force Training Simulator and Army CTC. These systems often use semiconductor lasers that send optical code through free space to a receiver and are often referred to tactical engagement systems.

Tactical engagement systems may also be used in gaming or other non-military systems. For use in soldier training by the military, the tactical engagement system includes a laser transmitter that is mounted on a weapon such as a small arms weapon or other military platform, a receiver that includes one or more detectors, electrical circuitry to control the laser and process electrical signals from the detectors, and other components such as barrel flash detector. For small arms weapons the laser transmitter is often referred to as a small arms transmitter or SAT. The laser transmitter may also be mounted on a larger or smaller military platform, such as tanks, trucks, helicopters or planes, and on smaller implements such as pistols.

For these tactical engagement applications the laser beam quality and the laser beam propagation properties through the atmosphere can be important in, as well as the receiver design to receive the signal through the atmosphere. Laser diodes now used in many military systems produce elliptical beams and asymmetric beam profiles, and have laser wavelengths that shift significantly between devices due to manufacturing tolerances, and due to internal temperature changes.

A particular problem in many training and battlefield applications that use tactical engagement systems is that the laser transmitters and receivers must be battery operated, and therefore operate efficiently. While the laser transmitter need only be activated during an engagement, the receiver must be ready to receive optical data at any time.

Optical data networks may also be formed using Light Detection and Ranging (lidar) for mapping or position sensing, which may transmit optical signals through free space to collect information regarding positions of distant or nearby objects. In this case a laser beam is reflected off a distant object, or multiple distant objects, and detected at a detector or detector array placed closer to the laser. The resulting optical data collected by the detector or detector array from the reflected laser pulses are used to map a distance, or multiple distances to reconstruct a scene, based on a technique such as time-of-flight or similar approach. Many lasers used for these systems produce speckle, which is an interference effect. Speckle degrades the signal returned from a target because it cause non-uniform reflections due to the coherence of the laser beam. A related problem occurs due to scintillation for laser beams that propagate long distances through the atmosphere. Scintillation can be viewed as an interference effect due to fluctuations in air pressure, wind, thermal gradients, or other effects that may influence the refractive index of the atmosphere.

A Vertical Cavity Surface Emitting Laser (VCSEL) is a laser resonator that includes two mirrors that are typically distributed Bragg reflector (DBR) mirrors which have layers with interfaces oriented substantially parallel to the die or wafer surface with an active region. The active region may include one or more bulk layers, quantum wells, quantum wires, or quantum dots for the laser light generation in between. The planar DBR-mirrors comprise layers with alternating high and low refractive indices. Each layer has a thickness of approximately one quarter of the laser wavelength in the material, or an odd integer multiple of the quarter wavelength, or in some cases even integer multiple of the quarter thickness, depending on layer placement and optical interference effects. The mirror layers can produce intensity reflectivities that may be above 99%, and in other cases may be produce much lower values of reflectivity. Slightly lower values than 99% can be useful to obtain high extraction efficiency of the laser light from VCSELs, and much lower values can be useful for RCLEDs or LEDs. Mirrors can also be made of other materials, including dielectrics or metals.

RCLED's are described in U.S. Pat. No. 5,226,053. A RCLED is a light emitting diode (LED) that generates mainly spontaneous emission and generally operates without a distinct threshold. The drive voltage of a spontaneous emitter can be less than its photon energy divided by the electron charge, under which condition it ideally absorbs heat in its light emission process. The RCLED's drive voltage can also exceed its photon energy, under which it generally generates heat in its light emission.

For high speed operation in optical data networks electrical parasitics and self-heating of the laser generally must be low. Therefore the design of the laser should have sufficiently low internal electrical parasitics combined with sufficiently low self-heating to enable high speed. For example, speeds of 50 GB/s or greater are desired in some applications, especially those that use fiber optics, and even greater data speeds in excess of 100 GB/s are of interest. These speeds are difficult to achieve if the electrical parasitics of the laser is too large, or self-heating is too great.

Another problem in optical data networks, high power pumping, and lidar is that at high power the laser diodes tend to operate in multitransverse modes. For a tactical engagement system, for example, this multimode operation can degrade beam quality and limit the system performance. In lidar the multimode operation can also degrade the signal, and require additional optics to.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include optical data networks, laser transmitters for optical data networks, high power lasers, and semiconductor light sources comprising at least one vertical resonant cavity light source, such as a VCSEL, RCLED, or a surface-emitting LED which includes one or more selective buried acceptor diffusions that control the electric conductivity in and around an intracavity epitaxial phase-shifting layer or multiple layers to laterally confine one or more optical modes. A significant feature of disclosed buried acceptor diffusions is that the diffusion can proceed through a fully unintentionally doped current blocking layer and into the cavity spacer region of the light source and reduce the drive voltage and resistance of the vertical cavity device. The selective buried diffusion then provides an electrical conductivity change in the surrounding layers to direct current flow through the inner mode-confining region.

Disclosed semiconductor light sources thus provide a structure that provides both current blocking and mode confinement, and can reduce electrical resistance and drive voltage, and reduce the heating due to electrical resistance caused by hole transport in the cavity spacer. As used herein a "cavity spacer" is defined to be a cavity region that includes the active region where field undergoes phase change to create the resonance condition of the vertical cavity. Typically the cavity spacer thickness will be approximately an integer number of half-wavelengths thick. The cavity spacer generally may have an upper cavity spacer region or lower cavity spacer region. For example, in a full wave cavity spacer the first mirror layer may be an AlGaAs layer that has an Al composition that is increased over the material of the cavity spacer. If the active region is placed near the center of the full-wave cavity spacer it will have an upper cavity spacer region and a lower cavity spacer region. In a half-wave cavity, in contrast, the first mirror layer may be an AlGaAs composition that is lower than the cavity spacer. It is also possible that an active region is placed at the edge of a cavity spacer, if properly designed to be close to a field intensity peak formed by the cavity spacer.

Embodiments of the vertical cavity light source include at least one depleted heterojunction current blocking region (DHCBR) within an outer current blocking region of at least one of the upper mirror, lower mirror, and the active region. A conducting channel is within the inner mode confinement region that is framed by the DHCBR, wherein the DHCBR functions to force current flow into the conducting channel during operation of the light source. The conducting channel can be created by the selective acceptor diffusion. The selective acceptor diffusion creating the conductive channel can proceed fully into the vertical-cavity light source active region to also dope the active region with acceptors.

A DHCBR is defined herein to comprise first and second materials, where the respective materials are different materials (e.g., GaAs and AlGaAs or other heterojunction materials) interfaced with one another to form a heterojunction. The doping in the first and second materials may be the same, or the doping in the second material may be less than the doping in the first material. The first material being interfaced to the second material in the heterojunction depletes the mobile charge carriers of the second material to form a highly resistive region in the second material, so that the second material has no more than about $1 \times 10^{17}$ cm$^{-3}$ mobile charge carriers due to dopants. As such, the second material in the heterojunction is referred to herein as a depletable second material since it depletes in mobile charge concentration, such as from a concentration of about $10^{17}$ cm$^{-3}$ when in isolation, to a concentration of about $10^8$ cm$^{-3}$ to about $10^{15}$ cm$^{-3}$ when in the heterojunction interfaced to the first material.

Disclosed embodiments also include light sources with one or more doped regions in the cavity spacer layers. Doped regions such as p-type doping in the upper cavity spacer can increase the electrical confinement of the VCSEL, reduce its electrical resistance, and increase injection efficiency. The use of n-type doping in the lower cavity spacer can also reduce electrical resistance and increase injection efficiency. Embodiments are also described that can achieve low electrical parasitics to enable high-speed modulation.

Disclosed embodiments also include describe improved tactical engagement systems and laser transmitters for improved tactical engagement systems based on disclosed VCSELs, including VCSELs that use DHCBRs. These tactical engagement systems can provide improved and stable beam characteristics by using a VCSEL in the laser transmitter that includes a DHCBR, and provide increased capabilities in fidelity of data transmission during an engagement and/or greater capability in data collection during an engagement. The tactical engagement systems encoded laser data may be MILES, OSAG, or some other code. The improved tactical engagement system can make use of specially designed optics combined with the VCSEL to improve the beam quality and engineer its profiles. Therefore the improved tactical engagement system can transmit improved laser beams and improve the uniformity of the kill spot over distance. The VCSEL also enables increased spectral control in the laser transmission beam, and increased filtering at the detectors to reduce background noise due to sunlight or other stray light sources. Scintillation can also be reduced by use of VCSEL array including a plurality of VCSEL elements. Disclosed embodiments can also improve lidar systems by providing laser sources that produce improved beam quality, spectral control, and reduced speckle.

BRIEF DESCRIPTION OF THE DRAWINGS

FIGS. 4A-4D show various schemes for integrating the VCSEL into the laser transmitter of a tactical engagement system, and coupling the VCSEL to one or more collimating lenses, according to example embodiments.

DETAILED DESCRIPTION

Figure 1A:
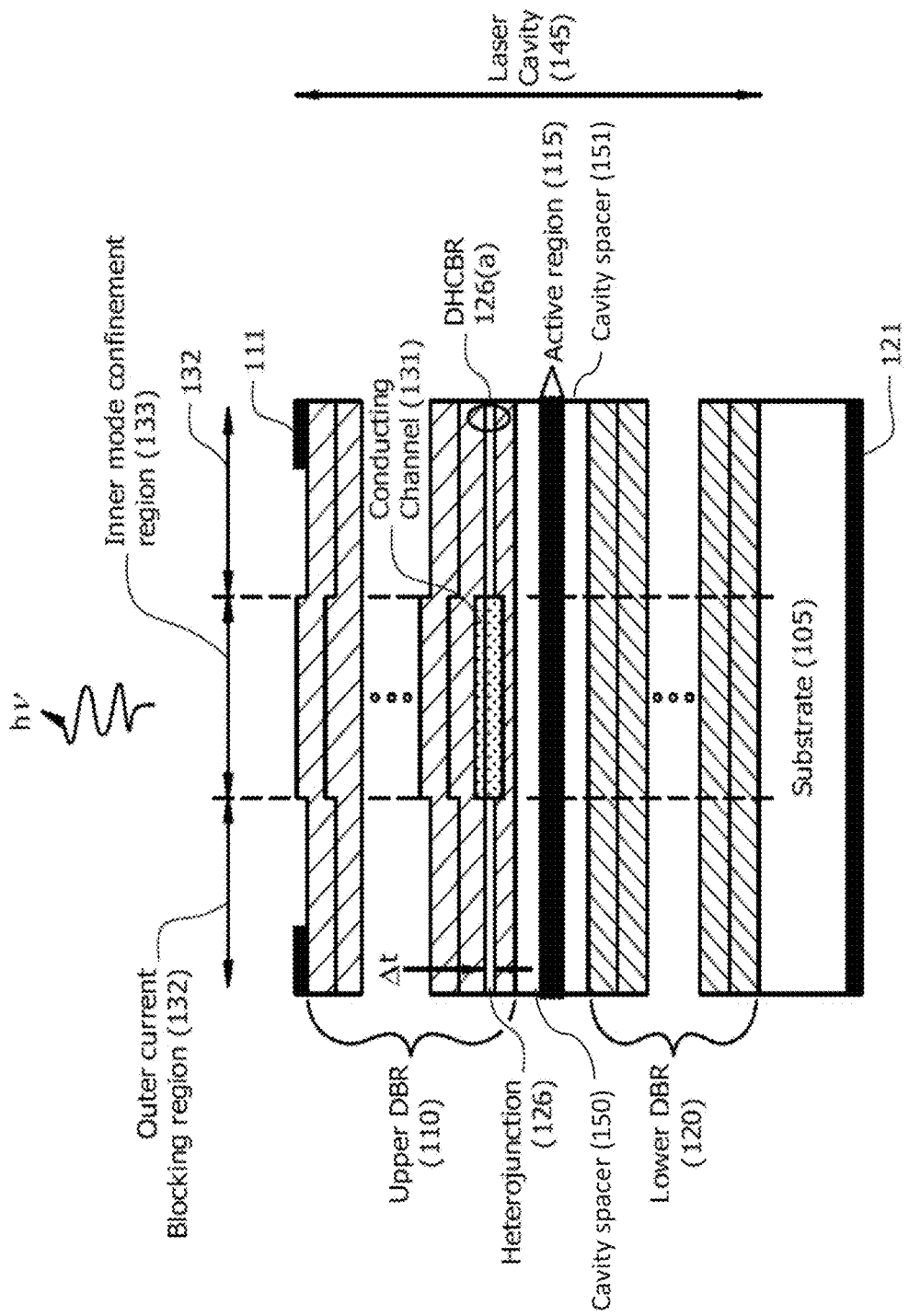
FIG. 1A is a schematic cross sectional diagram of a semiconductor vertical cavity diode light source that includes a selective diffusion that provides a conducting channel through an otherwise current blocking layer provided by a DHCBR which provides both optical and electrical confinement in an upper mirror region of the laser cavity, according to an example embodiment.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments.

One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Disclosed embodiments include semiconductor light sources that comprise diode lasers and arrays of such lasers based on selective (non-blanket) buried acceptor (p-type) diffusion that simultaneously provides both the electrical injection path into the laser and optical mode confinement, and the optical data networks that include the semiconductor light sources. Serial connection is also disclosed, such as by connecting an n-electrode contact of a first vertical-cavity light source to a p-electrode contact of a second vertical-cavity light source of an array. An optical mode confining phase shift may also be included in an otherwise planar resonant cavity. In one embodiment each acceptor or donor diffusion provides a conducting channel that defines the mode confinement area of a small resonant cavity light emitting diode, or a VCSEL. Disclosed arrangements can reduce the operating current or voltage and control the optical mode for improved sensors, data communication, high power light sources for optical pumping or materials processing, as well as other applications.

In the vertical resonant cavity light source a DHCBR is formed within an outer current blocking region of at least one of an upper mirror, a lower mirror, and the first active region that frames a conducting channel of the light source. The DHCBR forces current flow into the inner mode confinement region during operation of disclosed light sources. Selective acceptor dopant diffusion can also be performed in the inner mode confinement region to form a conducting channel laterally inside the DHCBR to further reduce electrical resistance into inner mode confinement region. The acceptor diffusion can be formed through the DHCBR and into the cavity spacer of the vertical resonant light source to further reduce the electrical resistance and increase the light source's efficiency.

In some embodiments, mesas are included. Mesas are known in the art as being structures that provide a step height which can improve current confinement, mode confinement (e.g., to provide single mode operation), and also reduce the threshold current for lasing. Fabrication methods are also disclosed herein that include using material beneath mesas initially not doped with dopant impurities to create a conductivity type different than the mesa and the semiconductor material above the mesa. Diffusion of dopant impurities from the mesa into the semiconductor material below the mesa can convert the semiconductor material immediately below to the same type as the mesa, while regions outside and below the mesa can remain substantially free of dopants. In this way a DHCBR can be formed outside the mesa to provide a high resistance region while the mesa region itself and the layer immediately below the mesa can provide low electrical resistance. Thus, electrical current may be forced to flow mainly through the mesa in the inner mode confinement region, so that efficient electrical injection is made into the same region that confines the optical mode.

An optical data communication data link may be comprised of disclosed vertical cavity light sources. The optical communication data link can be part of an optical communication data network for transmitting and receiving optical data, to perform switching of data links, or other data processing purposes. The optical data link includes electrical circuitry that receives electrical data input and converts the electrical data input into drive waveforms for the vertical cavity light source array, an optical transmission medium that receives the optical data signals from the vertical cavity light source array and carries the optical data to a receiver, and the optical receiver. The receiver includes a detector array that converts the optical data signals to electrical signals, and a transimpedance amplifier that may boost the electrical signal if needed, and convert it back into electrical data output. The arrays may include a single (1×1 array) vertical-cavity light source and a single (1×1 array) detector, or n×m elements of vertical-cavity light sources and detectors with n and/or m or greater than unity. The arrays may also take forms such as circular with densely packed elements to increase coupling efficiency to optical elements.

The optical data network based on the vertical-cavity light sources will generally include circuitry that sets the bias conditions and modulation conditions for the light sources, and temperature compensation. The bias circuitry is used to supply a direct current or steady-state component of power to each light source to maintain the drive level of the light source to obtain a high speed response. This drive level is adjusted automatically by the optical data network to maintain bias conditions to insure a high speed pulse responsive sufficient to maintain the desired bit error ratio. Generally the upper temperature operation of the vertical cavity light source required for efficient operation of the optical data network (uncooled operation) can be 70° C. or higher. The required temperature of the vertical cavity light source can be higher yet, and may be as high as 85° C. or even higher.

Self-heating in the vertical-cavity light source of the optical data network can be reduced by employing DHCBRs that enable high-heat flow mirrors to be used. AlAs for example can be used in the low index mirror layers, and AlAs is highly thermally conductive relative to many other semiconductor materials. Thus the optical data network can be made to have improved performance to produce higher data speed and/or higher temperature operation with increased reliability than what may otherwise be possible.

By making the light source smaller it can generally also be made faster. Considering only the limitations of the gain and cavity on speed of the vertical-cavity light source, the differential gain can generally be increased and the stimulated emission rate increased using the invention because of how it can minimize self-heating.

The modulation speed of the vertical cavity light source as limited by the laser gain and cavity can generally be described by the relaxation oscillation frequency of the gain and the cavity. This relaxation oscillation frequency is proportional to $$\omega_{RO} \propto \sqrt{\frac{dg(T)}{dn_e} \cdot [J - J_{Threshold}(T)]} \quad (1)$$

where $$\frac{dg(T)}{dn_e}$$

is the temperature dependent differential gain of the active region and $J_{Threshold}(T)$ is the temperature dependent threshold current density for lasing. The temperature T is the internal temperature of the vertical-cavity light source set by self-heating and the mount temperature of the vertical cavity light source in the transmitter stage of the optical data network. The maximum bandwidth of the vertical-cavity light source is related to the laser cavity bandwidth $\omega_c/Q$ where $\omega_c$ is the cavity bandwidth, and Q is the cavity quality factor. This cavity quality factor can be reduced by using AlAs in the mirror layers of the vertical-cavity light source to provide a high mirror contrast for a given mirror reflectivity product, and therefore a smaller Q for a given threshold current density. In this way both the self-heating and cavity quality factor can be reduced for a given threshold current density of the vertical-cavity light source.

The internal temperature T of the vertical-cavity light source can be maintained low relative to the mount temperature with the disclosed invention. This is obtained using the DHCBR and diffused conducting channel, and by making the vertical-cavity light source small. The DHCBR and diffused conducting channel, especially when combined with high heat flow mirrors, all serve to cool the vertical-cavity light source. In addition, the lithographic fabrication of the lateral size of the vertical-cavity light source enables it to be made small and yet retain high uniformity. As the vertical-cavity light source is reduced in size it can be made to generate less heat for a given drive current density above the threshold current density, and thus suffer less temperature rise internal to the light source.

As the vertical-cavity light source is made smaller its electrical parasitics can also be made smaller, since smaller areas outside the conducting channel are also needed to contact the light source. Because the power partly or fully provided by the electrical drive circuitry of the optical data network depends on the size of the vertical-cavity light source and its temperature dependence, reducing the temperature effects and/or drive requirements with smaller light sources can produce higher speed and more efficient optical data networks. Therefore the improved optical networks can operate at lower bit energy and higher temperature needed for hybrid or monolithically integration directly on chips that also include electronically circuitry. The improved optical data networks can then operate at higher speed, higher temperature, and more efficiently to lower their bit energy.

The high speed optical data network can also be limited in its transmission distance due to the transverse modal operation of the vertical-cavity light source, and its coupling to the optical medium. By making the vertical-cavity light source small, which can be achieved with the invention through lithographic patterning, it can be coupled to a single mode waveguide or fiber that has low chromatic dispersion. This can increase the transmission distance for a given modulation speed of the vertical-cavity light source. It can be an advantage to operate at wavelengths for which optical loss and chromatic dispersion are reduced as compared to multimode optical data connections that are often in the wavelength range near 850 nm. However 850 nm vertical-cavity light sources can also be made to operate in a single transverse mode using the invention. However, by making the vertical-cavity light source operate instead at ~1 µm or slightly longer, very high speed light sources are possible that can be made sufficiently small (≤4 µm in lateral dimension) to also operate in a single transverse mode. In this way high efficiency and low noise coupling can be made to single mode waveguides and fibers to obtain longer transmission distances that can in principle exceed 1 km. Longer wavelengths around 1.3 µm or 1.55 µm can achieve even longer distances.

In some embodiments it can be desirable that the vertical cavity light sources are integrated directly on the electrical driver circuitry in a hybrid fashion. This means of integration of the vertical cavity light sources can reduce electrical lead lengths and facilitate interconnecting a large number of vertical cavity light sources to the electrical driver circuitry. For example, 2-D parallel arrays of a large number of vertical cavity light sources may be more easily interconnected if mounted on the same circuitry, such as silicon complimentary metal-oxide-semiconductor (CMOS) circuitry that can be used for the electrical driver circuitry. The substrate can be removed in this case to create free-standing semiconductor lasers hybrid integrated into chips also containing CMOS or other electronic circuitry. The same is true for the detector array, which may be mounted on the transimpedance amplifier in a hybrid fashion, or may be made from the same materials of the transimpedance amplifier directly. A wide range of known means to create the optical transmission medium, include free space connections with optics, can be utilized. Optical transmission medium can also include fibers, and other types of optical waveguides in a nonexclusive list such as silicon waveguides, dielectrics, polymers, etc. Optical fibers can be made with sufficiently small core to enable single mode propagation at wavelengths from 900 nm to beyond 1 µm depending on the actual core size. More standard fibers can also be used that enable single mode propagation beyond about 1.2 µm, with accordingly longer transmission distances. For these the active material and DHCBR material can be chosen consistent with operation of the vertical cavity light source at these longer wavelengths. Either GaAs-based or InP-based materials may be used.

An important aspect of the VCSEL design for tactical engagement systems and lidar is to reduce the effects of scintillation and/or speckle, and improve beam quality. Extending the size of the VCSEL array to sufficiently large value, and reducing the size of the VCSEL to increase the number of emitters, can be used to reduce scintillation effects. An increased number of VCSEL elements can also reduce speckle. Use of the DHCBR in the VCSEL can provide high uniformity while maximizing the number of emitters for small emitter size. Reducing the emitter size is also recognized as a key to providing improved beam quality. The DHCBR VCSEL array can therefore improve both beam quality, improve spectral quality, and reduce scintillation effects over existing tactical engagement systems. Dense packing of the VCSEL elements can also be achieved to increase power density from the laser source.

Moreover, the beam pattern from the tactical engagement laser transmitter can also be improved using combinations of modes, for which the VCSEL elements radiate either single lobed far-field modes or donut modes, or combinations. In this way the beam properties close to the laser transmitter can be improved while maintaining efficient operation while keeping a uniform kill spot size. In addition, various types of ranging can be accomplished with a suitably designed receiver. It is also possible to create different regions of one or more VCSELs that couple to different optics. These improvements can be combined with improved detectors that provide increased filtering against background light sources, and with new capabilities in which the encoded laser data can be read on different detectors, or different collections of detectors. It also becomes possible to send wake-up pulses from the VCSEL transmitter, and reduce power consumption in the receiver.

FIG. 1A is a schematic cross sectional diagram of a semiconductor vertical cavity diode light source 100 that includes a selective diffusion which provides a conducting channel 131 through an otherwise current blocking layer provided by a DHCBR 126(a) in an upper mirror shown as upper DBR 110 of the laser cavity 145, according to an example embodiment. The layers shown may and typically will included graded material regions to reduce electrical resistance caused by material transitions. The DHCBR 126(a) may extend all the way to the cavity spacer layer 150 to increase the current blocking capability, and reduce capacitance due to the DHCBR 126(a). Therefore the entire region between heterojunction 126 and cavity spacer 150 may remain unintentionally doped or lightly doped outside the conducting channel 131 and inner mode confinement region 133.

Upper DBR 110 may also be replaced or partially replaced with other mirror schemes, such as combined with dielectric or metal layers. It may also include an optical coupling element. Although light source 100 is shown as top emitting, disclosed light sources can be also be bottom emitting. Bottom emitting devices may have their substrate removed to increase their efficiency and facilitate hybrid integration with the electrical drive circuitry. Bottom emitting devices may also reduce electrical parasitics that otherwise result from other means of electrode placement. Top emitting devices may also have their substrate removed. In the embodiment described relative to FIG. 1A, the substrate 105 may be an n-GaAs or an n+GaAs substrate. Other substrates and epitaxial materials can be used, such as InP, GaN, sapphire, GaP, InAs, Si, Ge, which are all commonly used to form semiconductor light emitters.

Although a substrate 105 is shown in FIG. 1A and other FIGs. herein, in some process flows the substrate 105 is removed at or near the end of processing, so that the light source 100 only includes the epitaxial layers that form the light source, with no supporting substrate. In this process flow the light source is generally transferred to another substrate or mount. For example, a substrate-less light source may be transferred to a silicon substrate for integration with silicon-based electronics, so that the epi film of the laser can be grown on its matching substrate (e.g., GaAs), since it may not be able to be grown on a silicon substrate due to epitaxial incompatibility. It may also be inserted into a display.

Light source 100 includes an inner mode confinement region 133 and an outer current blocking region 132. As described below, a disclosed selective diffusion forms the conducting channel 131 shown as part of the inner mode confinement region 133. In some cases the selective diffusion may proceed laterally for a short distance and therefore exist slightly outside of the inner mode confinement region 133. It may also be that the DHCBR extends somewhat into the inner mode confinement region 133. The important aspect is that the conducting channel 131 occurs within the inner mode confinement region 133 to provide overlap between a mode confinement region and an electrical injection region.

The upper DBR 110 includes an electrical contact 111, such as an acceptor (p) doped P+contact. Light source 100 also includes a lower mirror shown as lower DBR 120, such as donor (n) doped having an electrical contact 121 such as an N+contact. The DBRs 110, 120 each generally include 10 to 30 periods, such as 18-25 periods for the lower DBR 120 and 15 to 20 periods for the upper DBR 110 if semiconductor mirrors are used. Other mirror choices may work best with different mirror pair numbers. In one specific embodiment, upper DBR 110 can comprise p-AlGaAs/GaAs stacks, while the lower DBR 120 can comprise n-AlGaAs/GaAs stacks. P and n AlAs/GaAs mirror stacks can also be used, with appropriate grading at the interfaces if electrical injection is desired through the mirrors. The light source 100 is formed in at least two epitaxial growth steps. Lower DBR can also be replaced with output coupling layers, or a mirror approaching zero reflectivity. For operation at wavelengths <0.9 µm the mirror materials can comprise AlAs/AlGaAs mirror stacks.

The upper DBR 110 and lower DBR 120 can each comprise fully semiconductor DBRs, or comprise partial DBRs with added metal or dielectric layers that provide added reflectivity. In the case of added metal or dielectric layers the layer thicknesses can be chosen to obtain the needed interference in the emitted light such that the desired reflectivity is achieved. These thicknesses depend on the specific material parameters as known in the art.

An active region 115 is positioned between two cavity spacers 150 and 151, and their respective DBR's 110 and 120. The active region 115 can comprise at least a bulk layer, quantum well (QW) layer, quantum wire layer, or quantum dot layer. An example QW layer comprises InGaAs formed between adjoining GaAs layers. More than one layer may make up active region 115, such as multiple QW layers, bulk layers, quantum dot layers, quantum wire layers, and and/or combinations thereof.

One of the layer stack heterojunctions (i.e., junctions between two materials with different band gaps, e.g., AlGaAs/GaAs stacks) in the upper DBR 110 is shown as heterojunction 126. Heterojunction 126 includes DHCBR 126(a) within its outer current blocking region 132 and a conducting channel 131 in its inner mode confinement region 133. DHCBR 126(a) provides both optical mode and electrical confinement.

Conducting channel 131 can include acceptor doping in the range from about $5 \times 10^{17}$ cm$^{-3}$ to about $1 \times 10^{20}$ cm$^{-3}$, while the DHCBR 126(a) lateral to the conducting channel 131 has a doping level on its more lightly doped side that may be the same, or be significantly below, that of conducting channel 131 to provide lateral electrical confinement, such as a maximum acceptor doping of $1 \times 10^{17}$ cm$^{-3}$, maximum doping of $5 \times 10^{16}$ cm$^{-3}$, maximum doping of $1 \times 10^{16}$ cm$^{-3}$, such as a maximum doping of $1 \times 10^{15}$ cm$^{-3}$, including an even lower doping level when intentionally not doped during fabrication. For example, intentional doping may be eliminated from the more lightly doped side of the DHCBR 126(a), so that it contains only background impurity concentrations due to the epitaxial growth, often less than $\sim 10^{15}$ cm$^3$, such as doping in the range from $1 \times 10^{10}$ cm$^{-3}$ to $1 \times 10^{15}$ cm$^{-3}$. The depletable material side of DHCBR 126(a) has a voltage dependent depletion region thickness in the vertical direction shown as Δt.

The DHCBR 126(a) can be made thicker by removing all intentional doping below heterojunction 126. In such a case capacitance can also be reduced. The impurity diffusion can be performed to form the conducting channel 131 fully down to active region 115, or partially into cavity spacer 150. Deeper impurity diffusion can reduce the electrical drive voltage, and this can be advantageous for high speed operation to improve optical networks, and/or increase efficiency for high speed operation and high power laser systems. Furthermore the cavity spacer 150 can be designed to also contribute to current blocking capability of the DHCBR, for example by choosing a spacer material that has a larger bandgap than what may typically be used. Total cavity spacer thicknesses may be various optical wave thicknesses, including one-half wave, a full-wave, etc. Therefore a wide range of cavity spacer designs and DHCBR thicknesses can be used as long as proper field interference is maintained so that the vertical-cavity light source operates effectively. For example, the cavity spacer 150 may be lightly doped with acceptors to provide additional blocking of electron flow through the DHCBR. The lower cavity spacer 151 may also be doped with donors to lower the electrical resistance into the light source, including increasing current funneling into the inner mode confinement region 133.

The current blocking ability of the DHCBR 126(a) can be described by the contact resistance it creates, given in the units of ohm·cm$^2$ ('Ω·cm$^2$). This contact resistance is given approximately by the equation below in terms of the depletion layer thickness, hole concentration in the depleted layer, $p_{DHCBR}$, and hole mobility, $\mu_h$, as $$p_{DHCBR} = \frac{\Delta t}{q\mu_h p_{DHCBR}} \qquad (2)$$

where q is the electronic charge. The hole concentration in the depleted layer is set by the valence band discontinuity as well as the doping levels. As an example, a DHCBR formed from undoped AlAs with Δt=850 Å clad by p-type GaAs with the GaAs acceptor doped to $10^{18}$ cm$^3$, can yield a hole concentration in the AlAs as low as $2 \times 10^9$ cm$^{-3}$. The corresponding contact resistance of the DHCBR 126(a) will be approximately 200 'Ω·cm$^2$. Even a 1 V drop across the DHCBR would produce only ~0.005 Å/cm$^2$ leakage current density around the active device. A 250 µm×250 µm light source 100 embodied as a VCSEL chip would produce ~3 µA of leakage current, which is considered to be negligible. Etching, ion implantation, or other techniques can also be used to further restrict the device area that includes the DHCBR 126(a), to achieve low capacitance or dense packing in arrays, and eliminate leakage currents through the DHCBR relative to the active region current in conducting channel 131.

Lithography applied to inner mode confinement region 133 after an initial epitaxial growth step can be used to define selective doping in conducting channel 131, and thus very small size devices since the device area is generally only limited by the resolution of the lithography tool (e.g., ≤50 nm). This lithography step and semiconductor surface processing through etching can be used to remove some of the semiconductor material in outer current blocking regions 132 in a given layer (or layers) to enable the conducting channel 131 to be in the form of the mesa structure shown. The mesa structure can occur anywhere in the upper DBR 110. To achieve the minimum threshold for a given device size however it can be an advantage if the conducting channel 131 is placed within two optical wavelengths (free space wavelength divided by the refractive index ($n_f$) in the crystal) distance to the active region 115, and for the mesa to be between 5 Å to 300 Å in height, with the optical wavelength relative to that in the semiconductor material. An acceptor-diffusion from the remaining semiconductor material in the conducting channel 131 not removed using lithography can then be performed, including in the epitaxial growth apparatus. If the diffusion is performed outside the growth chamber, after diffusion the semiconductor surface can then be cleaned and the wafer placed back in the semiconductor epitaxial growth apparatus to form subsequent epi layers to complete the upper DBR 110.

The diffusion from the remaining crystal region can be performed in the epitaxial growth apparatus. Thus, conducting channel 131 can provide a mesa including an acceptor diffusion level (or donor diffusion level) sufficient to provide the conducting channel 131 in inner mode confinement region 133 through an otherwise current blocking layer heterojunction 126. This diffusion can extend into the cavity spacer 150 to lower the electrical resistance of the laser, effectively forming the p-type conducting channel within the cavity spacer as well. The acceptor diffusion can also penetrate the active region 115. The cavity spacer region 151 below the active region 115 can also be doped or partly doped with donors to insure high injection efficiency into the laser's active material. This deeper acceptor diffusion into the cavity spacer and possibly through the active region 115 can therefore increase the laser efficiency and speed, and aid in controlling lateral hole flow for small laser active areas. The deep acceptor diffusion can reduce the drive voltage and differential resistance of the vertical-cavity light source.

The mesa may also be removed following or during diffusion. In this case a nearly planar interface can be achieved between the inner mode confinement region 133 and outer current blocking region 132. This mesa may be removed by chemical etching or thermal etching, including inside the growth chamber or outside the growth chamber prior to performing the epitaxial regrowth. In this way the mode confinement can be adjusted to favor single transverse mode operation. Confinement can also be elliptical or some other pattern, for example to control polarization and/or transverse mode behavior.

Figure 1C:
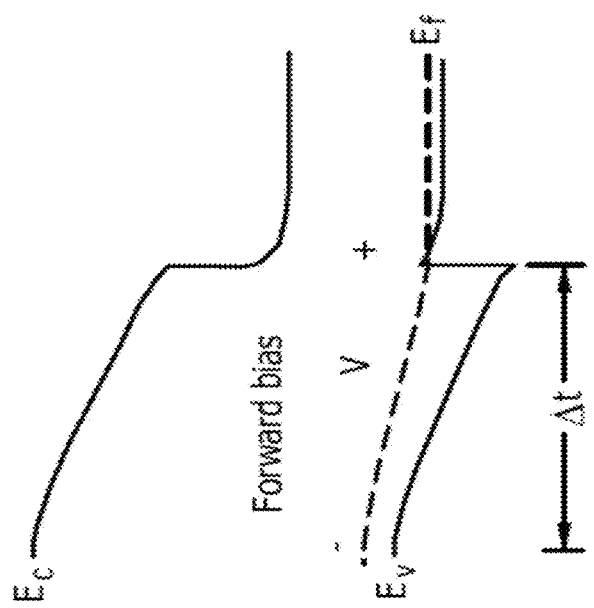
FIGS. 1B and 1C are band diagrams depicting the shape of energy bands of a DHCBR lateral to the conducting channel of the light source shown in FIG. 1A under zero bias and a forward bias, respectively.
Figure 1B:
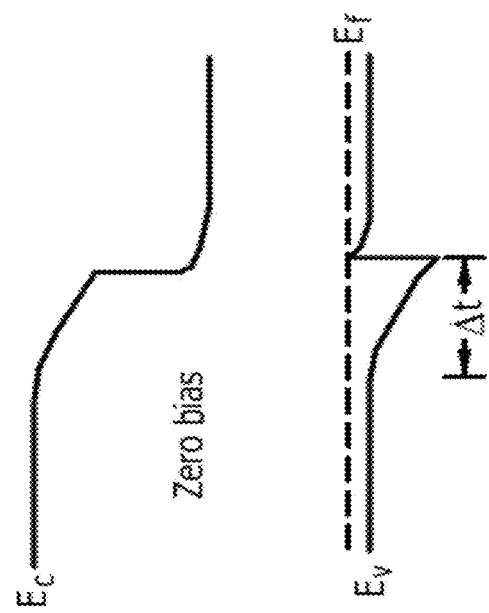

The band diagrams shown in FIGS. 1B and 1C depict the DHCBR 126(a) shown in FIG. 1A under zero bias and a forward bias, respectively. The width of the depletion region $\Delta t$ in DHCBR 126(a) can be seen to increase with a forward bias voltage applied (forward bias applied between contacts 111 and 121) which serves to further block the current flow across the DHCBR 126(a) and thus direct the current to the conducting channel 131. If two heterojunctions are used, the depletion width may remain fixed with applied bias.

Considering the contact resistance for the p-conducting channel with thickness $\Delta t$, it can given approximately by $$\rho_{Channel} = \frac{\Delta t}{q\mu_h P_{Channel}} \quad (3)$$

where now $P_{channel}$ is the hole concentration in the conducting channel. Considering an acceptor diffusion, the hole concentration in the conducting channel may be $10^{17}$ cm$^{-3}$. The contact resistance of the conducting channel can be less than $5 \times 10^{-6}$ 'Ω·cm$^2$, more than 8 orders of magnitude less than for some DHCBR designs. Even for a high current density excitation of $10^4$ A/cm$^2$, the voltage drop over the conducting channel would be only ~50 mV.

The conducting channel however can also suffer increased contact resistance due to heterojunction effects. In addition, the hole concentration in the conducting channel formed by acceptor diffusion will in general depend on the incorporation of acceptor impurity in the conducting channel materials. Therefore the particular material compositions making up the DBCBR can be selected based on a desire to achieve both a current blocking characteristic in cavity region 132 and a conductivity level in the conducting channel 131 for low voltage drive in inner mode confinement region 133. Higher hole concentrations can decrease the voltage drop over the conducting channel 131 to a few mV.

Figure 2:
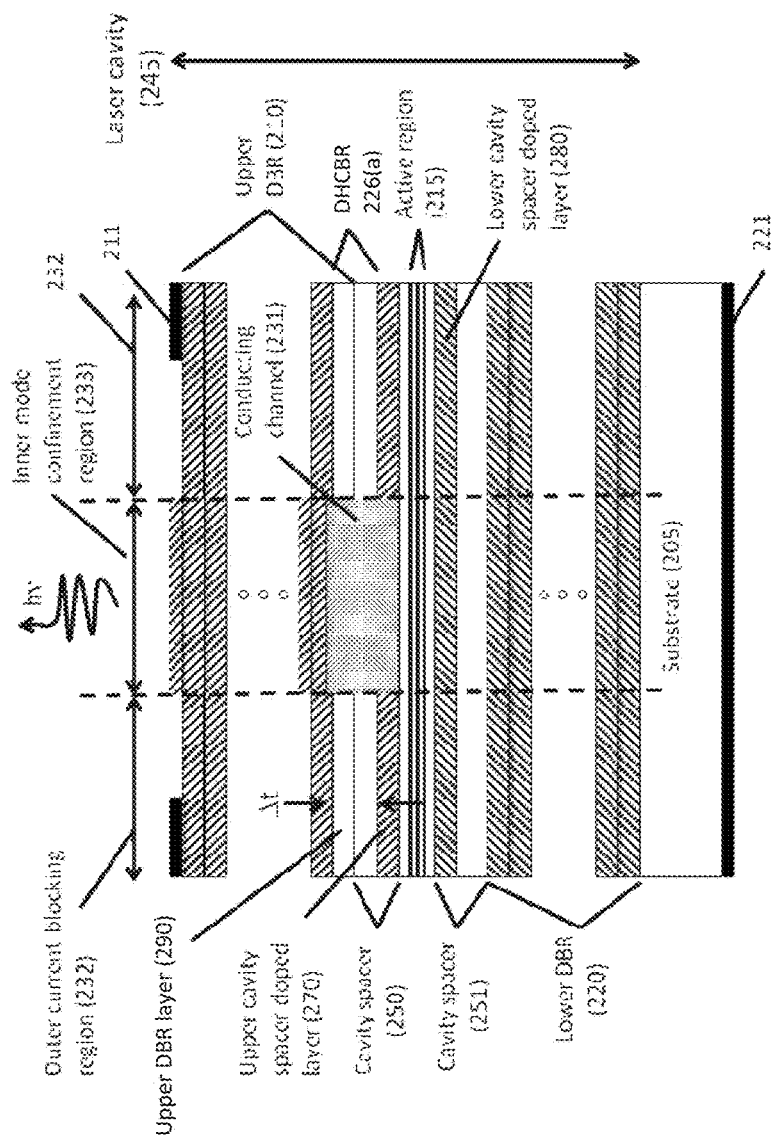
FIG. 2 is a schematic cross sectional diagram of a semiconductor vertical cavity diode light source that includes a selective diffusion that provides a conducting channel through an otherwise current blocking layer provided by a DHCBR which provides both optical and electrical confinement in an upper mirror region of the laser cavity, according to an example embodiment.

FIG. 2 shows light source 200 being a second embodiment that can reduce the internal capacitance and increase the current confinement with an increased depleted thickness $\Delta t$ of the DHCBR 226(a). This embodiment uses a p-type upper cavity spacer doped layer 270 placed between the DHCBR 226(a) and the active region 215. A second n-type lower cavity spacer doped layer 280 may also be used to reduce electrical resistance. Other features shown in FIG. 2 include a substrate 205, upper DBR 210, electrical contact 211, lower DBR 220, electrical contact 221, conducting channel 231, outer current blocking region 232, inner mode confinement region 233, laser cavity 245, cavity spacer layer 250, lower cavity spacer layer 251, and upper cavity spacer doped layer 270.

In this case the thickness of the DHCBR 226(a) is extended by eliminating intentional doping in the first quarter-wave layer of the upper DBR layer 290, and part of the cavity spacer layer 250. An upper cavity spacer doped layer 290 may be used in the upper cavity spacer layer 250 to block electron flow to the DHCBR 226(a), and reduce electrical resistance and maintain high injection efficiency into the quantum well active region 215. Upper cavity spacer doped layer 270 may be placed anywhere in cavity spacer layer 250, or fully include the cavity spacer layer 250. With a proper heterostructure design to effectively block electron current the depleted region can also be extended fully through cavity spacer layer 250. The lower cavity spacer layer 251 may also include an n-type lower cavity spacer doped layer 280 to maintain proper injection and reduce electrical resistance in the spacer region. Lower cavity spacer layer 251 may be fully doped n-type so that the n-type lower cavity spacer doped layer 280 includes most or all of lower cavity spacer layer 251, or partially as shown in FIG. 2. The doped layer 280 may also be placed at different positions in the lower cavity spacer 251.

An advantage of light source 200 and similar embodiments is that it can combine low capacitance with low electrical resistance. The doped layer 270 need only be sufficiently thick to block electron current from the lower cavity spacer region 251. For a full wave cavity spacer and a VCSEL operating at 850 nm, the thickness $\Delta t$ of the DHCBR can be made ~0.12 μm thick with upper cavity spacer doped layer 270 occupying the lower half of cavity spacer layer 250. This gives an estimated capacitance of the DHCBR of $9.5 \times 10^{-8}$ F/cm$^2$. An advantage of the invention is that the VCSELs can be made smaller and yet maintain precise size control for low cost and to maximize performance. A 4 μm diameter VCSEL for example, may require a 5 μm surrounding region for electrical contacting. However proton implant can be used outside this region to isolate the capacitance to the 5 µm surrounding area.

Because no deep etching is required, the surface remains planar for precise processing. The 5 µm thick surrounding area essentially gives a region of 9 µm diameter, with the 4 µm active VCSEL occupying an area of $1.3 \times 10^{-7}$ cm$^2$. The 5 µm thick surrounding region of DHCBR includes an area of $2.6 \times 10^{-7}$ cm$^2$. Therefore absent pad capacitance, the 4 µm diameter VCSEL would have a parasitic capacitance due to the DHCBR of ~25 fF. The p-channel resistance on the other hand is limited by mobility and doping level in the p-channel. Taking this doping level due to p-diffusion as $10^{18}$ cm$^{-3}$, and the mobility as 50 cm$^2$/(V·s), the p-channel resistance of the VCSEL is estimated to be 12 ohms. The RC time constant of only the DHCBR and p-channel for the 4 µm VCSEL is 0.3 ps, or a bandwidth of ~53 GHz. In fact the active region capacitance is in series with the DHCBR and will reduce the capacitance somewhat. Electrical current spreading in the upper DBR for holes to reach the p-channel also contribute to the electrical resistance. However in practice the contact ring now assumed to be 5 µm in thickness can be much less, and even 2 µm may be possible because of the ability to use fine line lithography on the planar surface. In addition, the DHCBR thickness can be significantly increased in thickness by making the upper cavity spacer 250 sufficiently thick to create a 3/2 lambda cavity. These and other design approaches enable high speed operation with the invention.

A significant aspect of the DHCBR is that its improved temperature properties in the VCSEL can be used to make improved optical data links. The optical link generally includes a housing for electronic circuitry that receives data in electrical form and conditions the electrical signals to drive DHCBR comprising VCSELs that produce the optical data signals. This housing increases in temperature during operation of the optical link, which increases the temperature of operation of the VCSELs. The speed with which optical data can be transmitted by the link through an optical medium such as an optical fiber, waveguide, or free space, and received by photodiodes and additional electronic circuitry, that converts the optical data back to electrical data, may largely be set by the temperature performance and speed of the VCSELs.

Transceivers place the transmitting and receiving electronics and photonics components in a common housing, and allow both sending and receiving data by electronic circuitry, VCSELs, and photodiodes contained in a single housing. If the optical medium is optical fiber, and the fiber permanently fastened to the housing contains the interface electronics, VCSELs and photodiodes, the complete system can form an active optical cable. By using DHCBR comprising VCSELs, the optical links including active optical cable can be made to operate over a wider temperature range, and/or with higher speed, and with greater reliability. These advantages are important for applications, for example, in which large numbers of transceivers or transmitters are used in close proximity and cause heating and/or for which the transceivers or transmitter have small packages. For example, consumer products based on active optical cables may have small housings to conserve space, and the same can be true for optical data links used in space and satellite communications. Data centers and high performance computers can use large numbers of densely packed transceivers and/or transmitters of the optical data networks.

The thickness (Δt) of the DHCBR can therefore range from ~10 nm to greater than 0.5 µm, limited by the formation of the p-channel. By increasing the thickness the capacitance of disclosed light sources, such as a VCSEL, can be reduced. At the same time the capacitance is reduced, the electrical and thermal resistances can remain low because of the all-epitaxial structure.

The DHCBR can also be used to make very small area light sources such as VCSELs and RCLEDs. This is because the conducting channel is formed lithographically, which also forms the lateral cavity of the device. Therefore the conducting channel 131 can be as small as 100 nm in diameter, or smaller based on the available lithographic tool. This provides the opportunity to make very small sized VCSELs and RCLEDs for dense integration into various systems, increasing the system's capabilities. The very small sized VCSELs can be used to transmit high speed optical data signals. The small sizes are particularly useful for integrating onto Si photonic chips, since the small sized VCSELs can couple their outputs to Si photonic waveguides. The small sized VCSELs are also important for improved sensors, since reducing their cavity size can improve their single mode properties.

Small RCLEDs or VCSELs are also useful for driving up-converters to produce red, green, and blue light sources. By making the RLCEDs and VCSELs with very small device sizes, a large number of devices can be simultaneously produced on as common substrate using low cost semiconductor processing. Disclosed devices can also be combined with epitaxial lift-off techniques, which could make the RCLEDs and VCSELs very low cost. The RCLEDs are especially attractive for this, since they can use low Al content in their n-type layers and mirrors to ease the lift off. This could make them useful for ultrathin displays, and/or curved displays. VCSELs may also be used this way. Arrays of the vertical-cavity light sources can be made to have two-dimensional matrix addressing, and be used for monochromatic displays or combined with red, green, or blue up-converters to make multi-color displays. Electrical addressing can be further facilitated by mounting the vertical-cavity light sources on silicon circuitry and using the circuitry to control the array addressing. In this way the electrical addressing can be improved.

The display can be comprised of a thin screen that can contain the up-converters and RCLEDs or VCSELs, and the electrical interconnection of the pixels. Matrix addressing can be used to interconnect the pixels, based on luminescence decay times of the up-converters. In addition, the display may include the electronic circuitry to receive a video display signal, and convert it to electrical driver signals for the RCLEDs or VCSELs to excite the up-converters and display an image. In such a display the up-converters that emit the red, green, or blue light could be placed in their own small cavities. These can be metal coated, with Ag or Au for example, for high output coupling and optical isolation. Other metals can also be used and may have advantages in cost or thin film material properties. These up-converter cavities may be sub-µm to 300 µm or more in lateral size, depending on the display and pixel resolution. The RCLEDs or VCSELs infrared light emission can be efficiently coupled to the up-converter cavity through a small aperture, so that once trapped, the infrared light emission is efficiently absorbed by the up-converters. By placing the up-converters in their own cavities, the pixels can be isolated. This can lead to very high quality red, green, and blue pixels or monochrome pixels in a display that may only be a few hundred microns thick, and/or used to produce a curved screen for the display.

If the conducting channel 131 or 231 and DHCBR 126(*a*) or 226(*a*) are defined in lateral size to be elliptical, or at least non cylindrical, the polarization of the light source such as a VCSEL may also be controlled. This polarization control can arise due to preferred reflectivity by the Bragg reflectors, favoring lower loss for one polarization vs. another. However, other mechanisms may also control the polarization. Controlling the polarization can be used to make improved sensors. This is because the cavity size can be made so small using the DHCBR and conducting channel that only one spatial lasing mode may be allowed with within the gain bandwidth of the active material. This gain bandwidth may include spectral shifts due to temperature changes, as well as electronic bandfilling. Elliptical or non-cylindrical lateral confinement can then be used to control polarization.

The ability to make the cavity very small and control the polarization can lead to VCSEL sources capable of making improved sensors, especially those using Doppler sensing as well as atomic clocks. These sensors include housings that comprise the electronic circuitry and photonic components to direct light beams from the small lasers, and detect difference in the reflections of the light beams to perform sensing. Or, the VCSELs are used to excite rare earth atoms, by properly modulating the VCSEL output to create resonant optical drive conditions with the atoms. In these sensors the electronic circuitry and sensor performance depends on the single mode qualities of the VCSEL. Therefore these sensors can be improved by highly single mode, polarization controlled VCSELs that can be fabricated by reducing the size and controlling the shape of the conducting channel 131 or 231.

Various schemes are possible for mounting the vertical-cavity light sources on silicon. The silicon may contain additional electronic circuitry needed to process data and provide the proper bias and modulation conditions to the light source. The silicon may also be used as an optical breadboard for fiber alignment, or for its thermal properties. Because the vertical-cavity light sources can be small their chip size or footprint when mounted on silicon can also be small. Therefore their density can be high. A thermally conductive interface such as metal, metal solder, metal epoxy, etc., or a wafer-fused interface is possible to limit self-heating in the light source and improve the system performance.

As noted above, disclosed embodiments also include improved tactical engagement systems and laser transmitters for improved tactical engagement systems based on disclosed vertical resonant cavity light sources such as disclosed VCSELs for which disclosed tactical engagement systems are generally described to comprise one or more. These tactical engagement systems can provide improved and stable beam characteristics by using a VCSEL in the laser transmitter that includes a DHCBR, and provide increased capabilities in fidelity of data transmission during an engagement and/or greater capability in data collection during an engagement. The VCSEL also provides a new way to improve and/or actively control the beam, or to deliver multiple beams, including separately coded, from the laser transmitter. This also includes generating various mode patterns, such as combinations of single lobed radiation patterns combined with donut patterns, and the use of microlens arrays, VCSELs with separately addressable emitters, and lenses with multiple focal regions to modulate or combine beams generated by the VCSEL emitters.

The tactical engagement systems encoded laser data may be MILES, OSAG, or some other code. The improved tactical engagement system can make use of specially designed optics combined with the VCSEL to improve the beam quality and engineer its profiles. Therefore, disclosed tactical engagement systems can transmit improved laser beams and improve the uniformity of the kill spot over distance. The VCSEL also enables increased spectral control in the laser transmission beam, and increased filtering at the detectors to reduce background noise due to sunlight or other stray light sources. Scintillation can also be reduced by use of the VCSEL array. Disclosed embodiments can also improve lidar systems by providing laser sources that produce improved beam quality, spectral control, and reduced speckle.

Improved receivers are also described that use combinations of detectors that can be combined in parallel to increase the signal level and reduce the effects of scintillation, as well as produce separate electrical signals to more precisely define kill spots, including location on the body. These detector arrays can be designed with low noise detectors that have increased filtering because of their use with VCSEL transmitters. In addition, improvements are disclosed in the detector Field Of View (FOV) due to changes that provide improvements in the detectors lensing. The tactical engagement system can be modified to operate at slight longer wavelengths than 904 nm, such as 940 nm or longer to slightly beyond 1 micron for a VCSEL grown on a GaAs substrate. In particular, very high quality VCSELs can be produced at 975 nm, and this wavelength could maximize the reduction of noise at the detectors. In this way additional filtering can be used at silicon photodetectors to reduce background light and lower noise. Sharp cutoff absorption filters are described below to achieve the filtering. The disclosed DHCBR techniques can also be applied to 1550 nm VCSELs made from materials nominally lattice matched to InP substrates. In this case either InP or InGaAlAs can be used to create the DHCBR.

To improve the efficiency of the receiver and increase battery lifetime the tactical engagement system can include a wake-up pulse that is transmitted from the laser transmitter. This wake-up pulse is transmitted prior to the muzzle flash that would otherwise trigger the transmitter to transmit its encoded optical data. The wake-up pulse activates the receiver to then be in a ready state to receive the encoded data. The VCSEL is particularly attractive to generate this wake-up pulse since its pulse energy can be varied to exceed that used for the encoded data, without substantially degrading reliability.

Disclosed VCSEL embodiments are disclosed that can improve the uniformity of the kill spot and near kill spot by using combinations of VCSELs that deliver donut modes, and VCSELs that deliver single lobed modes, from the same array. Individual electrical addressing is also possible, for turning on different types of VCSELs or different VCSELs coupled to different types of lenses. In this case a single lens may have different lensing regions that provide a variety of beam divergences.

Additional embodiments are disclosed for improved lidar systems that use disclosed VCSELs based on DHCBRs. These VCSELs, formed in arrays, can provide improved spectral and beam properties to improve the accuracy of the lidar system, lower the cost of the lidar system by providing lower cost laser sources, and reduce speckle. The improved lidar system can have improved position measurement accuracy by providing improved and variable beam patterns from the VCSEL source.

Figure 3:
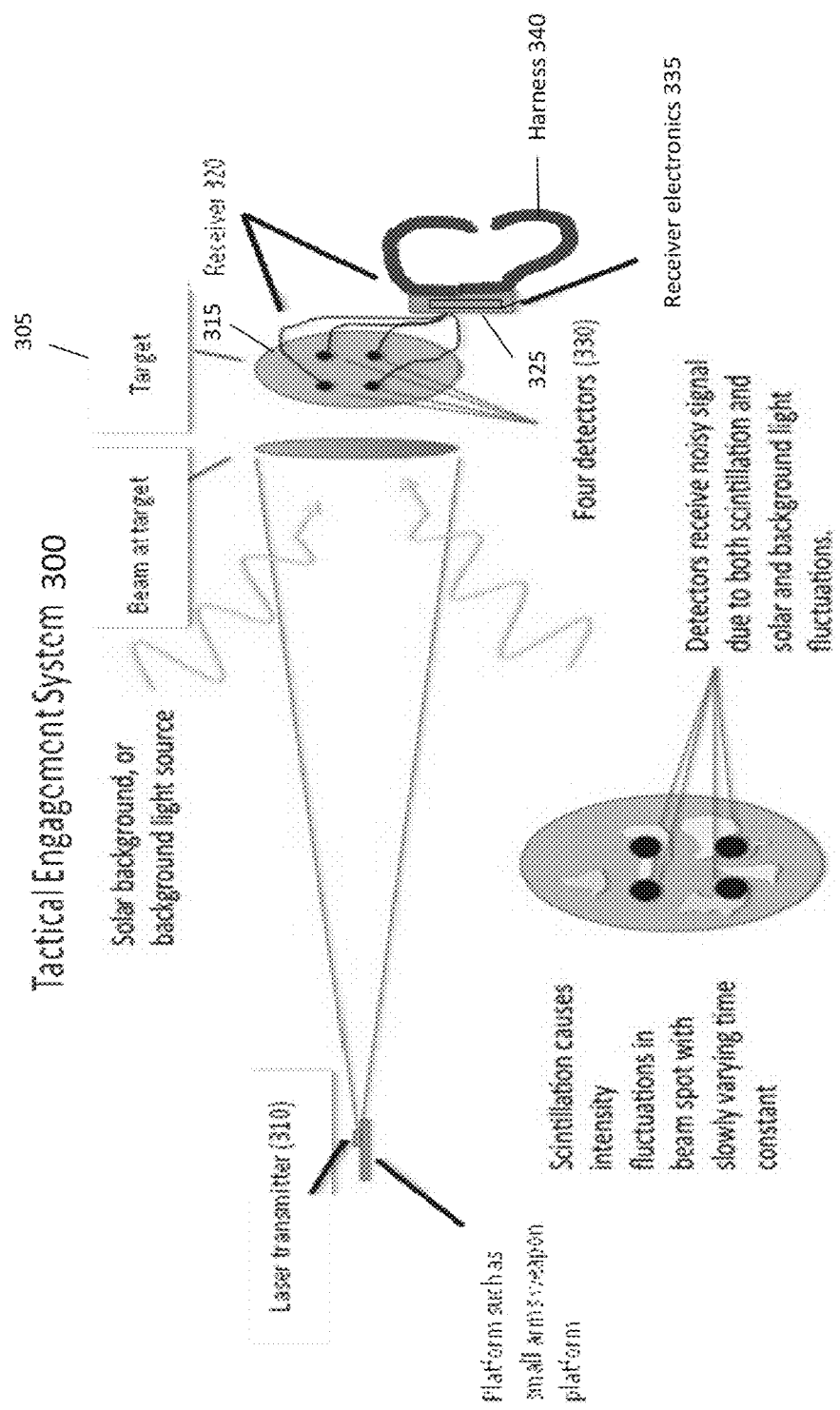
FIG. 3 shows a schematic diagram of a tactical engagement training system comprised of a weapon mounted laser transmitter that includes a VCSEL, a region of free space atmosphere through which the encoded laser data is transmitted, and a receiver comprised of multiple detectors arranged to receive the encoded laser data, according to an example embodiment.

FIG. 3 shows a schematic representation of a tactical engagement system 300. The tactical engagement system includes a laser transmitter 310 containing a laser diode that can be mounted on a military platform such as a soldier weapon, tank, helicopter, or aircraft. The detectors 330 shown may be connected separately to additional electronic circuitry in the receiver 320, in parallel, or partly in parallel and partly separately to the receiver's electronic circuitry to detect the encoded laser pulses. Interconnecting the detectors separately can assist in obtaining spatial information about the incoming laser pulses. Although the encoded laser data is described as pulses, other methods may be used to encode the laser data such as analog techniques, pulse amplitude modulation, etc.

The laser transmitter 310 includes a housing containing electronic circuitry for detecting the firing of blank or live ammunition, circuitry for driving the laser diode with modulation to transfer encoded data onto the laser signal, and the laser diode. For example, a detector may be used to detect a muzzle blast from the weapon. In this case light emitted from the muzzle blast will trigger the laser transmitter to deliver a series of laser pulses or otherwise modulated laser signal encoded with data related to the particular tactical engagement. Below additional circuitry is described in an embodiment that can also deliver a wake-up pulse to the receiver.

FIG. 3 also shows the receiver 320 including four detectors 330 generally placed in detector housings for placement in various locations on the target 305, one or more housings 325 containing receiver electronics 335 for decoding and saving the encoded laser data received from the laser transmitter 310, electrical interconnections (wiring) 315 between the detectors 330 and the receiver electronics 335, and a harness 340 for mounting the receiver electronics 335 and detectors 330 on a target. The detectors 330 are shown interconnected in parallel to the receiver electronics 335 for detecting currents generated by detectors 330 responsive to receiving the laser signal. The detectors 330 may be connected through an inductor, a transimpedance amplifier, or some type of electronic buffer.

The target 305 may be a soldier or other personnel, or another military platform on which the receiver is mounted. It is also possible for the receiver electronics 335 to be mounted separated from the detectors 330, for example with longer wiring 315 or wireless connections. The receiver electronics 335 includes circuitry for various types of data processing such as comparison of received laser pulses with expected laser code, and processing the laser code to determine such parameters as type of weapon used, player identification code, time of day, distance between the shooter and target, and even atmospheric conditions.

The types of encoded laser data are provided simply to provide examples, and other types of data may also be used in addition or independent of any of the above. Also, the encoded laser data may be comprised of other types of transmission schemes besides pulses, and may also include noise reduction schemes. An improved tactical engagement system can be realized by utilizing a disclosed VCSEL as the light source in the laser transmitter 310. When designed as described herein, the VCSEL-based tactical engagement system can provide increased beam quality, increased spectral control of the laser emission for increased filtering at the detector, increased signal to noise ratio for the laser signal at the detector, increased eye safety and reduced scintillation over conventional tactical engagement systems. The improved system is realized through wavelength control in transmitting the encoded laser data to the receiver 320, and improved beam quality in the properly designed VCSEL-based transmitter. The improvements can be obtained at wavelengths such as ~905 nm or longer to ~1 μm, as well as longer wavelengths including 1550 nm.

FIGS. 4A-4D shows example ways a disclosed VCSEL can be packaged into the laser transmitter for coupling to output optics using an optical subassembly. Other arrangements are also possible besides the examples shown in FIGS. 4A-4D. The coupling optics are designed to achieve the desired beam quality from laser transmitter. An advantage of the VCSEL is its ability to produce circularly symmetric modes for low cost and efficient coupling to a range of output optics. Hermetic packaging in a metal can or use of hermetic films on the VCSEL can be used for reliability.

FIG. 4A illustrates a right angle prism 410 coupling light from a disclosed VCSEL 400 on a surface mounted printed circuit board 405 into an output lens 435. However, the right angle prism 410 may be part of the output lens or a separate element. FIG. 4B illustrates a disclosed VCSEL 400 incorporated in a metal can 420 containing a window (not shown), and coupled to an output coupling element 425. FIG. 4C shows a disclosed VCSEL 400 integrated with an output lens 435 in the same metal can 445.

FIG. 4D shows the incorporating of a large area VCSEL array 450 in a metal can 465, along with an output lens 435. This package can improve eye safety and decrease scintillation. It also enables maximum cooling of the VCSEL chip for a given power. Such VCSEL arrays 450 are of interest to generate both single lobed far-fields and donut shaped far-fields, and combining the two as are also possible with the optical subassemblies shown in FIGS. 4A-4C. The output lens 435 may be a simple curved lens, some structured lens that produces a tailored radiation pattern to define a uniform kill spot over a range of distances, a Fresnel lens, or some other optics yet. This is also true for the other subassemblies. A disclosed VCSEL laser transmitter can transmit encoded laser data with a much tighter wavelength tolerance than known laser transmitters. This is because of the short cavity of the VCSEL.

For an operating temperature from −30° C. to 70° C., the transmitter's combined manufacturing tolerance, spectral width, and wavelength variation over temperature can be ≤30 nm. This narrow emission from the VCSEL can reduce the detector spectral bandwidth for accepting encoded laser data to as small as ≤50 nm. The signal to noise ratio due to background solar radiation or other stray light can therefore be increased in the VCSEL transmitter, even by a factor of three or more due to increased filtering at the detector. Smaller increases can also produce a significantly improved tactical engagement system. Since the system must operate in a range of environmental conditions such as bright sunlight or artificial lighting such as in buildings, reducing background noise due to these stray light sources improves the performance under the most extreme operating conditions that may be encountered such as battlefield conditions. These may include both a high level of background light and a high level of obscurants such as smoke, fog, fog oil, or other obscurants.

Figure 6:
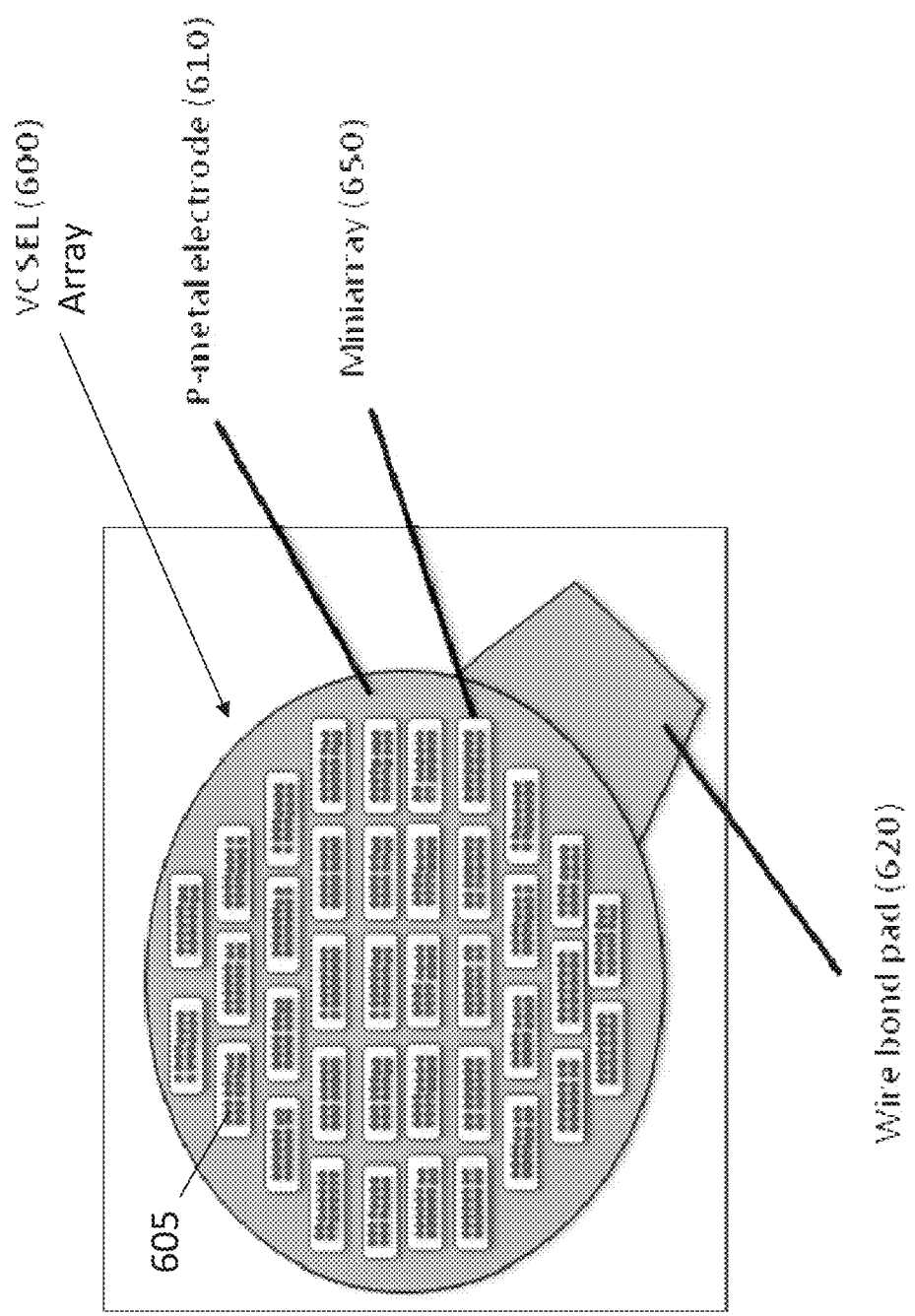
FIG. 6 shows a schematic top view of an example VCSEL layout using DHCBRs, according to an example embodiment.

The DHCBR is particularly attractive for designing the VCSEL for the tactical engagement system's laser transmitter. FIG. 6 described below shows a disclosed VCSEL array design based on the DHCBR. The embodiments include arrays of small sized individual VCSEL elements (e.g., about 3 μm diameter or less), with the number of VCSEL elements chosen to approximately match an optimal impedance of laser drive circuitry. In practice the laser power required to overcome the solar background and other noise sources for high fidelity detection at the target can be several watts or more. At the same time, wavelength control and beam quality is best for small VCSELs, including those that can be created in special shapes that emit much lower power from individual VCSEL elements.

The VCSELs have advantages in being able to emit multiple types of optical modes, and in easily being coupled to various types of lenses such as microlens array, or another lens configuration. For example VCSELs can be combined between a larger lens array, with each lens element sufficiently large to produce its own beam for tactical engagements. In this manner the laser transmitter system can use multiple beams directed towards the topic for increased range and position information. Each separate lens diameter may be on the order of ~5 mm or more, to produce its own usable beam from a VCSEL array. For example a five spot system could be generated with a center beam, a left middle beam, a right middle beam, a top center beam, and a bottom center beam.

By transmitting an additional encoded signal the separate beams can be detected at the receiver. The VCSEL array for each lens may be fabricated on a common chip or separate chips, depending on packaging. It's also possible to use a microarray lens in front of one or more VCSEL arrays, and produce different direction couplings to a single lens. This can be an advantage to achieve multiple beams from a given VCSEL chip. The different VCSEL beams can then be coupled to a single common lens. A larger package size such as shown in FIG. 4D can be attractive. The output lens 435 may be a single lens or comprised of multiple lens elements formed in an array.

If the VCSELs are in ring configurations, the donut modes can result. Alone, these donut modes may not be attractive for targeting in many tactical engagement system, since these modes have high intensity in a ring shaped pattern in the far-field, and low intensity in the center. However by combining donut modes with modes created by VCSELs sufficiently small to produce single transverse mode operation, improved beam characteristics can be created to improve the kill spot that arises from the laser transmitter and receiver. This is especially true at close range. Moreover the VCSELs can be made in other shapes, such as rectangles or ellipses, to generate desired beam shapes. These VCSELs of various shapes can be combined in arrays with single transverse mode VCSELs, and coupled through microlenses to one or more output lenses. Again these microlens arrays may be designed to generate multiple beam paths and multiple divergences. For example VCSELs producing donut modes may be coupled to sections of a microlens array that produce wide divergence, and VCSELs producing single transverse modes coupled to sections of a microlens array that produce lessen divergence. In this means the VCSELs enable donut modes to be transmitted to increase a kill spot size at ranges close to the laser transmitter, by proper combining with single transverse modes.

Similar design approaches are possible for rectangular and elliptical modes that can be generated by the DHCBR VCSEL. A VCSEL generating a more or less rectangular mode can be coupled to a matching lens, so that the radiated beam also has a rectangular beam pattern. In this case the dimension of the lens must be matched to the desired beam and collection angles from the VCSEL array. Radiating two orthogonal rectangular beams would also enable greater determination of a hit profile than a single beam. Additional beams can be added using either additional VCSELs or additional separate emitting regions on a given VCSEL chip. It can be an advantage to have these beams with overlapping hit profiles to provide continuous spatial information using encoding to determine which beams are impinging on the detectors.

These techniques in modifying the beam or beams using VCSELs can be combined with detector thresholding or other techniques. Although this disclosure does not restrict the size of the VCSEL, small VCSELs in an array can be desirable to provide increased mode stability against temperature changes. By using only sufficiently small VCSEL elements in an array that deliver single transverse mode emission, or combining these with VCSEL elements such as ring VCSELs that generate donut modes, the improved beam quality and high reliability for high power pulse generation can be obtained over greater ranges of drive level and greater ranges of operating temperature.

The VCSEL laser transmitter provides a means for providing wide dynamic range over the transmitted laser energy while maintaining the ability to produce high reliability. The VCSEL mirrors can be fully semiconductor with no regrown or cleaved interfaces at the active material. Therefore, for example, a high energy pulse can be delivered from the laser transmitter to serve as a wake-up pulse to the receiver. Such a system is able to dramatically increase receiver capability and/or increase battery lifetime by enabling a low power standby mode in the receiver at times not involving a tactical engagement.

Figure 5:
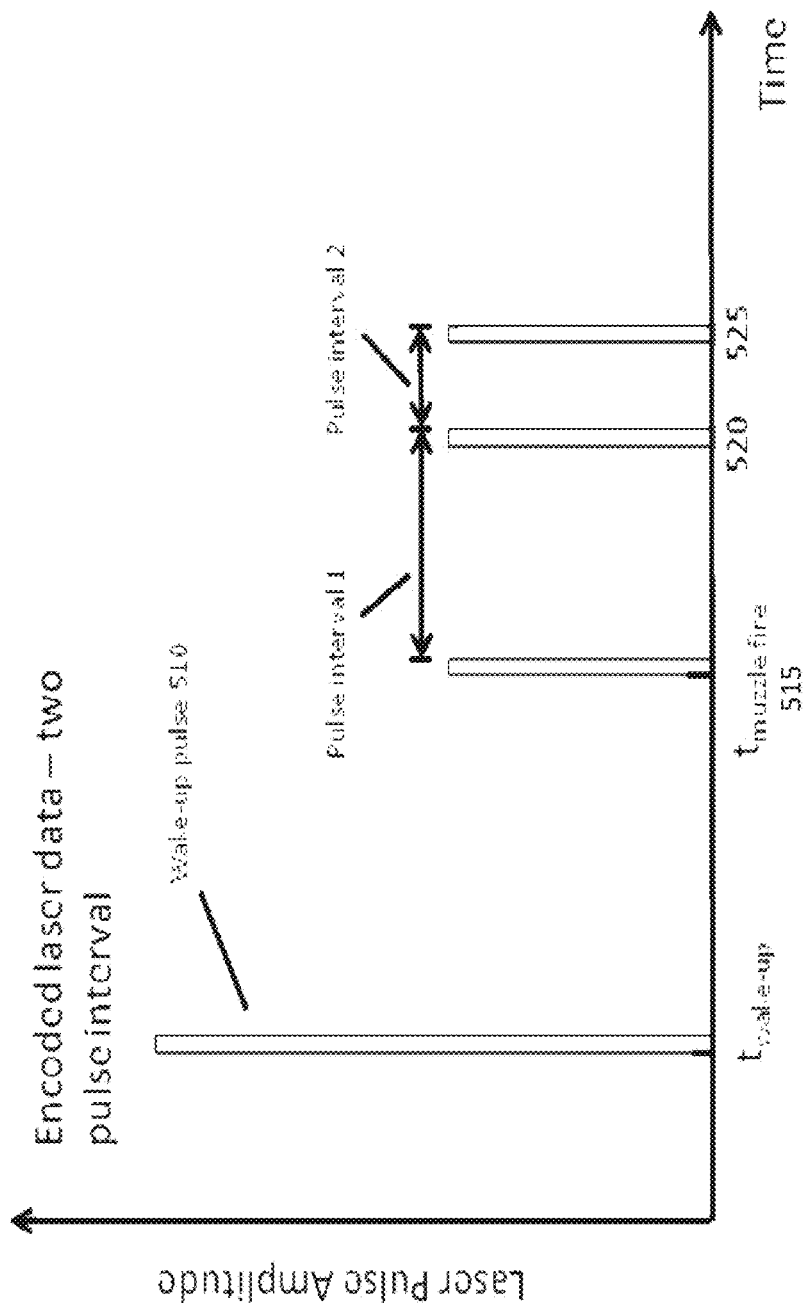
FIG. 5 shows a timing diagram that includes a "wake-up" pulse followed by encoded laser data, according to an example embodiment. The wake-up pulse is triggered prior to the muzzle blast that results from firing a blank ammunition, or live ammunition. Encoded optical data is transmitted following the wake-up pulse, such as upon detecting the muzzle blast at the laser transmitter.

Improved laser transmitters and receivers can use a wake-up pulse transmitted by the VCSEL laser transmitter prior to its transmitting the encoded laser data, as illustrated in the amplitude vs time plot shown in FIG. 5 which shows encoded laser data 520 and 525 sent in separate pulse intervals (pulse interval 1 and pulse interval 2) relative to a time of a muzzle fire pulse 515 along with a wakeup pulse 510. The wake-up pulse 510 is triggered from the laser transmitter by the soldier or other signal prior to the muzzle fire 515 that results from firing a blank or live ammunition that triggers the laser transmitter to output the encoded laser data 520 and 525. The wake-up pulse 510 can then bring one or more of the detectors or group of detectors to a biased condition to improve sensitivity and speed capability, while also maintaining long battery lifetime.

The improved tactical engagement system that uses the wake-up pulse 510 may have an increased battery lifetime as well as increased speed and sensitivity over prior art systems. The VCSEL laser transmitter can transmit a high peak power pulse without damage to its mirror, so that pulse energy in the wake-up pulse can exceed that of the encoded laser data. By turning on only various segments of interconnected detectors that include those detecting the wake-up pulse, beam analysis can also be performed on the encoded laser data to provide additional information. This can include more precise identification of the hit, for example on a body part or certain region of the body, and/or directional information.

As mentioned above the optical coupling lens may be a simple curved lens or some type of more advanced lens. Multi-electrode contacts can also be used to couple various regions of the VCSEL emitters that may be turned on and off separately, to the optical output element (output lens). Therefore both donut modes emitted directly from the VCSEL, and/or single transverse lobed modes emitted directly from the VCSEL can be obtained. In addition, different regions of either donut modes or single transverse lobed modes can be coupled to different regions of an optical output element, with either separate or combined electrodes, to generate preferred beam characteristics as well as time the emission to provide additional information concerning ranging or position of the laser beam relative to the receiver.

Particular problems with tactical engagement systems include atmospheric scintillation and laser beam absorption, as well as beam quality and spectral quality from the laser transmitter. Maximum pulse power can also limited by reliability of the laser diode used in the laser transmitter. In some encoding schemes, the ability to vary the pulse amplitude as well as the pulse interval can be of interest to increase data rate, and therefore the amount of data that can be transmitted. Use of a disclosed VCSEL in the tactical engagement system can make improvements in these parameters because of its unique laser properties.

Disclosed VCSEL as described above can be provided as an array, although large area single apertures may also be used to provide spectral control. Arrays however can use sufficiently small VCSELs to produce the desired single lobed far-field desired for tactical engagements at distances beyond tens of meters. The impedance of the VCSEL array can be designed according to the power level desired from the transmitter. The DHCBR VCSEL is uniquely suited for this since small VCSELs can be fabricated lithographically for high yield across large size wafers and from wafer to wafer. The DHCBR VCSEL can therefore improve the performance of the tactical engagement system and produce high yield in dense arrays of small VCSELs for low cost.

FIG. 6 shows a top view of an example VCSEL array 600 comprising a plurality of miniarrays 650 designed to produce single lobed emission from the laser transmitter, such as for use in a tactical engagement laser transmitter, and achieve uniform electrical injection. In this case the VCSEL array 600 is comprised of single transverse mode VCSEL elements 605 that are densely packed and interconnected, with 16 VCSEL elements 605 shown in each miniarray 650. The total number of VCSEL elements 605 shown in FIG. 6 is 304. Very dense packing of the individual VCSEL elements 605 can be achieved using the DHCBR by eliminating the metal electrode between some of the elements. Electrical conductivity to the VCSEL elements 605 is maintained by providing metal electrodes to regions close to the densely packed VCSEL elements 605.

If the miniarrays are based on ring shaped VCSELs the emission will generally be into donut modes. The divergence of the donut modes will follow the size of the rings. This is also true if the VCSEL elements are made into rectangles or ellipses of sufficiently small size. Thus by using various sized rings or other shapes, donut mode or other beam patterns can be achieved with different divergence angles. These can be combined with small sized VCSELs that produce single lobed far-fields. These can also be separately addressed by forming multiple electrodes on the VCSEL chip to address different regions of the VCSEL chip. By separately addressing and sequencing in time, various types of ranging can be created to measure range between the laser transmitter and the receiver, based on one-way laser propagation. As described above, this type of ranging can be implemented using a receiver that can identify different spatial patterns, and/or different laser intensities.

As shown in FIG. 6 there is a p-metal electrode 610 contacting a wire bond pad 620 which contacts VCSEL elements 605 in the miniarrays 650. The miniarrays 650 are useful when single transverse mode operation is desired from the VCSEL elements 605, along with dense packing. To insure single transverse mode operation the emitter sizes for the VCSEL elements 605 can be designed to be 2.5 μm or smaller. This size and the needed uniformity or provided by the DHCBR VCSEL, while the packing density is achieved using its lithographic and planar processing. To operate with high efficiency the array element number is designed so that each single mode VCSEL is also reasonably close in peak power to its maximum efficiency. For example, 1.2 W can be delivered from 304 DHCBR VCSELs of 2 μm size, with each single mode VCSEL element delivering ~4 mW of pulsed power.

Oxide or proton implanted VCSELs, or another VCSEL technology may also be used. In some cases additional optical elements may be used for beam shaping. This can be beneficial for example to convert a donut shaped mode emitter from a larger VCSEL, to a top-hat or some other intensity profile. The benefit of increased spectral control is still retained, though beam quality may not be as high as with single mode VCSELs. There are therefore added benefits to realizing the tactical engagement system using DHCBR VCSELs.

A 2 μm diameter DHCBR VCSEL operating at a wavelength between 900 nm to 1 μm produces single lobed emission from single transverse modes over its full range of operation. The DHCBR VCSEL produces high power conversion efficiency for the single mode VCSEL sizes, with measured maximum continuous wave power conversion efficiency of 46% at an output power of 1.3 mW, and a wavelength of 972 nm. The differential resistance of a single 2 μm element is ~150 ohms. For higher powers yet, larger arrays including more VCSELs can be used. For example, approximately 4000 of the 2 μm VCSELs would be required to deliver the 5 W at the maximum continuous wave efficiency, assuming negligible array heating. The 4000 element array of 2 μm VCSELs can therefore be designed to have an impedance of <50 mohm and produce a low voltage for the needed drive current to deliver the 5 W laser pulse. For example, an approximately 6 to 7 Å peak drive current is required, so the voltage drop due to resistance in the VCSEL array can be <350 mV.

As shown in FIG. 6, with suitable interconnection VCSEL elements 605 embodied as 2 μm VCSELs can be densely packed into miniarray 650 to reduce the overall array size, and yet provide uniform electrical injection. Rows or segments of VCSEL elements 605 can be formed lithographically with no metal between using the DHCBR. Metal traces can then be formed between these segments that are arranged to achieve the desired coupling to the output coupling optics. By using two rows of closely spaced VCSELs as shown in FIG. 6, the DHCBR VCSEL elements can be placed less than a micron apart and yet obtain uniform injection to all VCSEL elements. The miniarrays 650 can also be arranged into rows that run fully across an edge of the VCSEL array 600. The two rows are advantageous since each VCSEL except those on the edges sees a similar current path length to a metal electrode boundary. The DHCBR enables VCSEL elements to be placed in as close proximity as allowed by the lithography process. This can be as close as 10's of nanometers. In practice the desire to either achieve or prevent inter-element optical coupling will determine the minimum and maximum separations between array elements.

The beam divergence properties from the 2 μm DHCBR VCSEL has been measured and is approximately 30° full width at the $e^{-2}$ intensity points. The resulting array size can have an overall diameter for its emitting aperture of between 100 μm and 300 μm. Therefore an output coupling lens of ~5 mm diameter with a focal length of 1 cm can capture most of the VCSEL array emission. The VCSEL array of the tactical engagement system is designed to deliver laser pulses that may range from ~1 ns to >400 ns in duration. In addition, the VCSEL array can be driven to much higher powers than given above because of pulsing and an effectively low duty cycle. Because of the small VCSEL element size, the beam properties from the VCSEL can be improved over arrays that use larger VCSELs. This is particularly true for stability against temperature changes that occur during operation.

The VCSEL configuration described in FIG. 6 can also be important for lidar. For example, position sensing on robots, automobiles, or other platforms can be improved by the DHCBR VCSEL array using small sized VCSEL elements. While larger VCSELs can show mode shifts and beam changes with temperature due to cavity tuning, smaller VCSELs produce greater mode selectivity to the lowest order transverse mode. This can produce more accurate information when using the chip in a lidar application. Therefore the temperature of operation and accuracy of the lidar system can be improved. It is also possible to use multiple and overlapping beams in lidar with coding for the beams that can be decoded on the detectors. The beams can be turned on and off sequentially or operated in parallel. Thus new types of lidar systems are possible for which scanning may be achieved with multiple beams from one or more VCSEL chips engineered into desired shapes to produce desired beam patterns. Encoding the beams can then be used to identify which beams may be impinging on the lidar's detector or detector array.

In addition to improving beam pattern and the use of multiple beams, using large area arrays with reduced power density can be attractive to reduce scintillation. In this case it may be desirable even for small VCSEL elements sparsely separate the individual elements for the purpose of obtaining a large emitting area. The array for example may be ~0.5 cm to several centimeters per side, expressly for the purpose of obtaining a high density of separate beams. These separate beams are effective to reduce speckle at the target and scintillation due to atmospheric effects. In order to maintain compact optics coupling to a Fresnel lens may be desirable. Such a large area array can also be attractive for generating multiple beams as described above.

Tactical engagement systems such as shown in FIG. 3 can further be improved by incorporating improved detectors and collection optics for the detectors 315, in the receiver 320. Small detectors that use filtering and collection optics to produce a large Field Of View (FOV) have an advantage in low capacitance to produce high speed response. In addition, the cost of the tactical engagement system operating at 1550 nm detectors can be reduced, since the 1550 nm detectors are generally more expensive than the shorter wavelength detectors. At 1550 nm, the detector cost can be significant because of the cost of the 1550 nm detector chips, and the large number of detectors typically used in a receiver.

To reduce the size of the detector chip, maintain a compact package, and maintain a large FOV a Fresnel lens can be used. This Fresnel lens, or another suitable large lens, can be positioned so that the detector chip is defocused. Defocusing decreases the concentration of incoming light below its maximum, which is when the chip is in a focused position, but increases the FOV. A wide FOV of greater than 120° is usually desirable for the tactical engagement system.

To further increase the FOV and increase concentration due to the focusing optics a double lens system can be used. The first large lens of the detector housing and detector 315 couples the incoming beam to a second lens of high curvature placed close to the detector chip. This double lens system can minimize the detector chip size while producing a large FOV. A Fresnel lens for the first large lens can be used to reduce the package profile, and yet obtain an improvement in concentrating the incoming laser signal. In this way the detector chip can be made to have less capacitance and greater speed, and the cost reduced, especially for 1550 nm tactical engagement systems.

Figure 7:
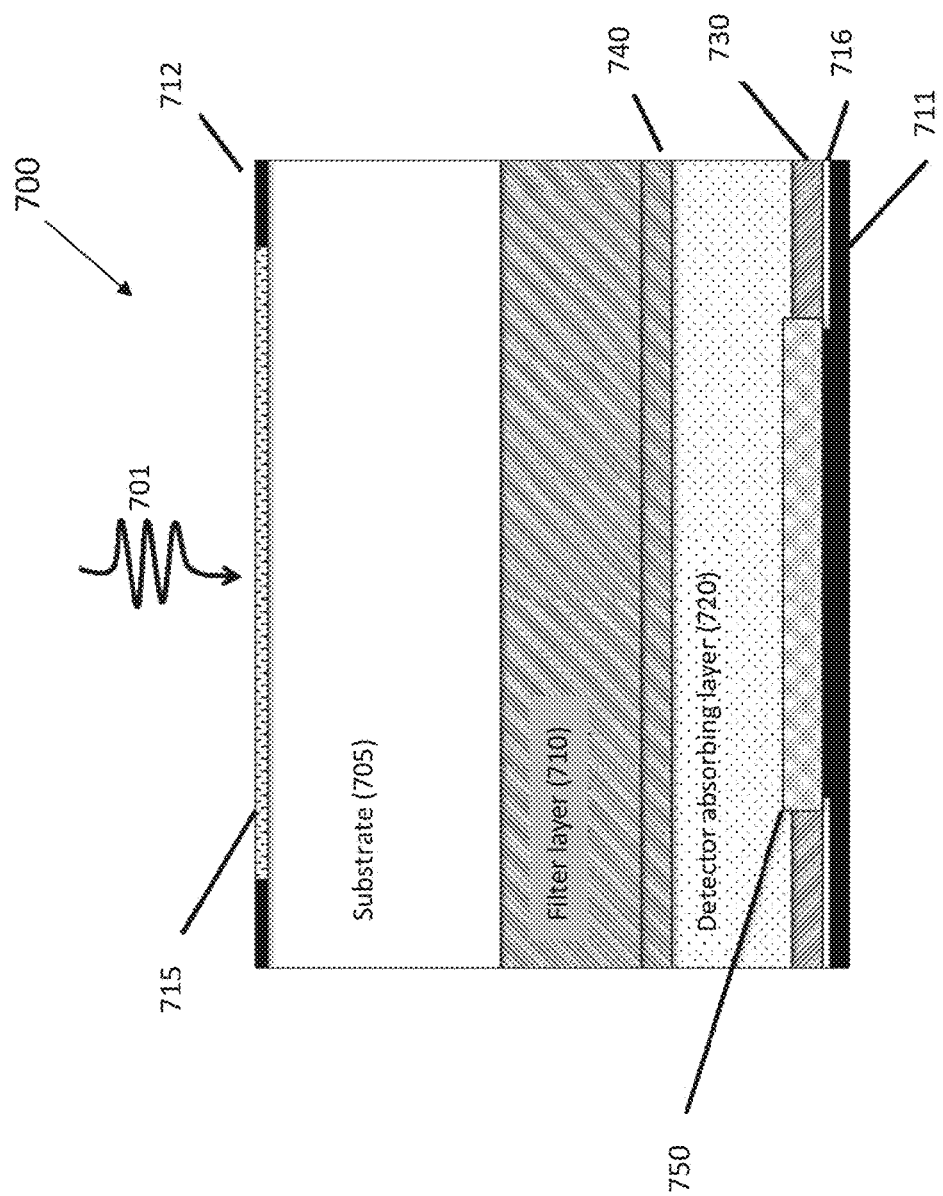
FIG. 7 shows a schematic of a detector in a housing that is part of the receiver, where the detector is coupled to a lens, a filter, and a cavity used to increase to increase the efficiency of coupling of laser light to the detector chip, according to an example embodiment.

To further reduce package size and cost, and improve detector signal to noise ratio, optical filtering internal to the detector can be used. FIG. 7 shows a cross sectional depiction of an example detector 700 and/or filter design for a tactical engagement system. Detector 700 contains an internal absorption filter that can take advantage of the sharp III-V absorption band edge to block background light signals and improve signal-to-noise ratio of a tactical engagement system. Detector 700 includes a metal electrode 711 shown connected to a p-side of the detector 700, a diffusion channel 750 to laterally isolate the detector's absorbing layer 720 from which the encoded laser light 701 generates photocurrent, an n-type confinement layer 740, a filter layer 710, a substrate 705, and antireflective coating 715, and an n-type metal electrode 712. Layer 716 is an electrically insulating (dielectric) layer, and layer 730 may be undoped or lightly n-doped. Other configurations of the detector 700 are also possible, and a significant element for the tactical engagement system is the addition of the filter layer 710.

This filter layer 710 is generally designed with a thickness and composition to block all incoming light except a narrow spectral range that includes the laser transmitter specified range of wavelengths (encoded laser light 701). The filter layer 710 is doped n-type to enable high electrical conductivity for current flow that arises due to photocurrent generated by the detector absorbing layer 720. The filter layer 710 may be comprised of bulk material, quantum wells to better trap carriers, quantum dots, or some other confinement structure. These designs can serve to more efficiently trap photogenerated carriers in filter layer 710. Here the carriers ideally nonradiatively recombine, or create randomly radiated spontaneous emission. The absorption band edge is important for filter layer 710. For example, a suitable filter for a 1550 nm wavelength can be chosen to produce a long pass filtering at a wavelength of 1400 nm at 20° C. This long pass filter wavelength is set by the energy gap of filter layer 710. If the substrate 705 is InP, the filter layer 710 can be comprised of absorbing and lattice matched materials of either InGaAsP, or InGaAlAs.

The filter layer 710 can then be made to reduce from an absorption value of ~5000 $cm^{-1}$ to <10 $cm^{-1}$ over a narrow spectral range. If the filter layer 710 is 2 μm thick, the absorption value can be made to decrease from ~63% absorption to ~0.2% absorption over a ~15 nm spectral range. Thicker absorption layers can be even more effective. Thus filter layer 710 can reduce the background light that would otherwise pass through the substrate 705. An InP substrate for example will pass wavelengths longer than ~910 nm at room temperature. For a 1550 nm detector absorbing layer 720 of lattice matched InGaAs, the detector long wavelength cutoff of ~1700 nm. Therefore the spectral region from 910 nm to 1700 nm, or 790 nm of spectral width of background light can pass the substrate and, without filter layer 710, generate photocurrent in the detector absorbing layer 720.

Using a thick filter layer 710, this spectral width can be decreased to 300 nm. This can improve the signal to noise ratio of the tactical engagement system by more than a factor of two. The filter layer 710 will exhibit a spectral shift of its long pass wavelength with change in temperature. This shift is approximately 0.27 nm/K. At the upper temperature range of 70° C. the long pass filter wavelength would shift to 1414 nm. If a narrow spectrum laser such as a 1550 nm VCSEL is used, the background noise can be reduced even further by designing for a longer long pass wavelength.

The 1550 nm detector may also be grown on a lattice-mismatched substrate such as GaAs for lower cost. In this case the filter layer may also be a lattice mismatched composition such as $In_xGa_{1-x}As$ with x~0.35. In addition, internally filtered detectors using the filter layer 710 may be realized on InP or GaAs substrates for wavelengths in the range of 900 nm to 1 µm. The detector may also be inverted, so that light is incident on the epitaxial growth side and the filter layer is also placed on the epitaxial growth side. In this case filter layer 710 can be made to absorb all incoming light, or be combined with an additional external filter.

The long pass III-V filter may also be realized alone as an external filter. For example, the GaAs substrate may be used to grow a filter layer according to what is disclosed above, where the filter layer is InGaAs. The composition can be chosen to absorb at a desired wavelength, such as 950 nm to build a long pass filter for a tactical engagement system operating at a laser transmission wavelength of 975 nm, or even a longer wavelength of 1 µm. Such a system can utilize high speed, low cost silicon photodiodes, and yet have reduced noise and increased signal to noise ratio over existing systems operating with high speed low cost silicon photodiodes operating at 904~905 nm. The detector absorbing layer 720 or region can include a p-n junction that may also be realized on the GaAs substrate for the epitaxial layers of the detector. Therefore internal filtering directly in the detector is a benefit to reduce component number and cost, and yet improve the performance of disclosed tactical engagement systems.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A semiconductor vertical resonant cavity light source (vertical light source), comprising:
an upper mirror and a lower mirror that define a vertical resonant cavity;
an active region within said vertical resonant cavity for light generation between said upper mirror and said lower mirror;
said vertical resonant cavity including an inner mode confinement region and an outer current blocking region;
a conducting channel within said inner mode confinement region that is framed by said current blocking region, wherein said current blocking region forces current flow into said conducting channel during operation of said vertical light source, and
at least one cavity spacer layer between said current blocking region and said active region;
wherein said conducting channel includes impurity doping that increases its electrical conductivity, and wherein said conducting channel extends into said cavity spacer layer, and
wherein said impurity doping of said conducting channel is at least one of different from and greater than an impurity doping in said cavity spacer layer between said current blocking region and said active region.

2. The vertical light source of claim 1, wherein said impurity doping of said conducting channel comprises a selective p-type diffusion.

3. The vertical light source of claim 2, wherein said cavity spacer layer comprises an upper cavity spacer doping layer.

4. The vertical light source of claim 1, wherein said upper mirror comprises a p-type distributed Bragg reflector (DBR) and said lower mirror comprises an n-type DBR.

5. The vertical light source of claim 1, further comprising a depleted heterojunction current blocking region (DHCBR) within said current blocking region of at least one of said upper mirror, said lower mirror, and said first active region;
wherein said conducting channel is framed by said DHCBR, and
wherein said DHCBR also forces said current flow into said conducting channel during operation of said vertical light source.

6. A semiconductor vertical resonant cavity light source (vertical light source), comprising:
an upper mirror and a lower mirror that define a vertical resonant cavity;
an active region within said vertical resonant cavity for light generation between said upper mirror and said lower mirror;
said vertical resonant cavity including an inner mode confinement region and an outer current blocking region;
a depleted heterojunction current blocking region (DHCBR) within said outer current blocking region of at least one of said upper mirror, said lower mirror, and said active region, and
a conducting channel that includes impurity doping that increases its electrical conductivity within said inner mode confinement region that is framed by said DHCBR, wherein said DHCBR forces current flow into said conducting channel during operation of said vertical light source,
one or more upper cavity spacer doping layers placed between said DHCBR and said active region.

7. The vertical light source of claim 6, wherein said impurity doping comprises a selective p-type diffusion.

8. The vertical light source of claim 6, wherein said conducting channel comprises said selective p-type diffusion that extends into said cavity spacer doping layer.

9. The vertical light source of claim 6, wherein said upper mirror comprises a p-type distributed Bragg reflector (DBR) and said lower mirror comprises an n-type DBR.

10. The vertical light source of claim 9, wherein at least one period of said p-type DBR or said n-type DBR includes a mesa in said conducting channel that is 5 Å to 300 Å in height.

11. The vertical light source of claim 6, wherein a more lightly doped side of said DHCBR has a maximum p-type concentration of $1\times10^{17}$ cm$^{-3}$, and wherein said conducting channel has a minimum p-type concentration of at least $1\times10^{17}$ cm$^{-3}$.

12. The vertical light source of claim 6, wherein a more lightly doped side of said DHCBR has a maximum p-type concentration of $1\times10^{16}$ cm$^{-3}$, and wherein said conducting channel has a minimum p-type concentration of at least $5\times10^{17}$ cm$^{-3}$.

13. A laser transmitter, comprising:
a housing having at least one semiconductor vertical resonant cavity light source (vertical light source) and electrical circuitry coupled to control said vertical light source therein for transmitting encoded laser data;
wherein said housing includes electronic circuitry for detecting a firing of blank or live ammunition;
wherein said housing includes at least one optical lens for transmitting a beam of said encoded laser data into free space;
wherein said vertical light source comprises:
an upper mirror and a lower mirror that define a vertical resonant cavity;
a first active region within said vertical resonant cavity for light generation between said upper mirror and said lower mirror;
said vertical resonant cavity including an inner mode confinement region and an outer current blocking region;
a depleted heterojunction current blocking region (DHCBR) within said outer current blocking region of at least one of said upper mirror, said lower mirror, and said first active region; and
a conducting channel within said inner mode confinement region that is framed by said DHCBR, wherein said DHCBR forces current flow into said conducting channel during operation of said vertical light source.

14. The laser transmitter of claim 13, wherein said laser transmitter includes electronic circuitry for transmitting a wake-up pulse to a receiver and electronic circuitry for transmitting said encoded laser data to said receiver, wherein a transmission of said wake-up pulse occurs prior to a transmission of said encoded laser data.

15. The laser transmitter of claim 13, wherein said vertical light source comprises at least one vertical-cavity surface-emitting laser (VCSEL).

16. The laser transmitter of claim 15, wherein said at least one VCSEL comprises a VCSEL array including a plurality of said VCSELs.

17. The laser transmitter of claim 15, wherein said VCSEL further comprises one or more upper cavity spacer doping layers placed between said DHCBR and said first active region.

18. A tactical engagement system including:
a laser transmitter, comprising:
a first housing having at least one semiconductor vertical resonant cavity light source (vertical light source) and electrical circuitry coupled to control said vertical light source therein for transmitting encoded laser data;
wherein said housing includes electronic circuitry for detecting a firing of blank or live ammunition;
wherein said housing includes at least one optical lens for transmitting a beam of said encoded laser data into free space;
wherein said vertical light source comprises:
an upper mirror and a lower mirror that define a vertical resonant cavity;
a first active region within said vertical resonant cavity for light generation between said upper mirror and said lower mirror;
said vertical resonant cavity including an inner mode confinement region and an outer current blocking region;
a depleted heterojunction current blocking region (DHCBR) within said outer current blocking region of at least one of said upper mirror, said lower mirror, and said first active region; and
a conducting channel within said inner mode confinement region that is framed by said DHCBR, wherein said DHCBR forces current flow into said conducting channel during operation of said vertical light source, and
a receiver in a second housing including at least one photodetector for generating electrical signals responsive to said encoded laser data and electrical circuitry coupled to an output of said photodetector for processing said electrical signals.

* * * * *

UNITED STATES PATENT AND TRADEMARK OFFICE
CERTIFICATE OF CORRECTION

PATENT NO. : 9,705,283 B1
APPLICATION NO. : 14/717692
DATED : July 11, 2017
INVENTOR(S) : Dennis G. Deppe and Guowei Zhao Page 1 of 1

It is certified that error appears in the above-identified patent and that said Letters Patent is hereby corrected as shown below:

In the Specification

Column 1, Lines 28-32: Delete: "This invention was made with Government support under Phase II SBIR Contract No. W911NF-14-C-0088 awarded by the Department of Defense (DOD) funding agency, the Army Research Laboratory. The U.S. Government has certain rights in this invention."

Insert: -- This invention was made with Government support under Phase II SBIR Contract No. W911NF-14-C-0088 awarded by the Department of Defense (DOD) funding agency, the Army Research Laboratory, and under the Air Force Research Laboratory (AFRL) of the DOD Phase II SBIR Contract No. FA8650-08-C1418. The U.S. Government has certain rights in this invention. --

Signed and Sealed this
Nineteenth Day of October, 2021

Drew Hirshfeld
*Performing the Functions and Duties of the
Under Secretary of Commerce for Intellectual Property and
Director of the United States Patent and Trademark Office*